(12) United States Patent
Takahashi et al.

(10) Patent No.: US 7,888,714 B2
(45) Date of Patent: Feb. 15, 2011

(54) SEMICONDUCTOR DEVICE AND METHOD OF MANUFACTURING THE SAME

(75) Inventors: Hidekazu Takahashi, Kanagawa (JP); Junya Maruyama, Kanagawa (JP); Daiki Yamada, Kanagawa (JP); Naoto Kusumoto, Kanagawa (JP); Kazuo Nishi, Yamanashi (JP); Hiroki Adachi, Yamanashi (JP); Yuusuke Sugawara, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 969 days.

(21) Appl. No.: 11/226,472

(22) Filed: Sep. 15, 2005

(65) Prior Publication Data
US 2007/0187790 A1 Aug. 16, 2007

(30) Foreign Application Priority Data
Oct. 4, 2004 (JP) .............................. 2004-291554

(51) Int. Cl.
*H01L 31/062* (2006.01)
(52) U.S. Cl. ...................................... 257/291; 257/458
(58) Field of Classification Search ................. 257/291, 257/292, 458, 459, E27.132, E27.133
See application file for complete search history.

(56) References Cited
U.S. PATENT DOCUMENTS

| | | |
|---|---|---|
| 4,085,411 A | 4/1978 | Genesi |
| 4,454,416 A | 6/1984 | Gontowski et al. |
| 4,485,301 A | 11/1984 | Gontowski et al. |
| 4,979,007 A | 12/1990 | Ogawa et al. |
| 4,988,631 A | 1/1991 | Ogawa et al. |
| 5,352,921 A | 10/1994 | Codama et al. |
| 5,420,452 A | 5/1995 | Tran et al. |
| 5,481,118 A | 1/1996 | Tew |
| 5,501,989 A | 3/1996 | Takayama et al. |
| 5,589,694 A | 12/1996 | Takayama et al. |
| 5,648,662 A | 7/1997 | Zhang et al. |

(Continued)

FOREIGN PATENT DOCUMENTS

EP 0251563 1/1988

(Continued)

OTHER PUBLICATIONS

"A Visible Light Sensor and an Amplifier Circuit"; *Denpa Shinbun*; 1 page & full English language translation; Oct. 2003.

(Continued)

*Primary Examiner*—Michael B Shingleton
(74) *Attorney, Agent, or Firm*—Fish & Richardson P.C.

(57) ABSTRACT

Considering further promotion of high output and miniaturization of a sensor element, it is an object of the present invention to form a plurality of elements in a limited area so that an area occupied by the element is reduced for integration. It is another object to provide a process which improves the yield of a sensor element. According to the present invention, a sensor element using an amorphous silicon film and an output amplifier circuit constituted by a thin film transistor are formed over a substrate having an insulating surface. In addition, a metal layer for protecting an exposed wire when a photoelectric conversion layer of the sensor element is patterned is provided between the photoelectric conversion layer and the wire connected to the thin film transistor.

34 Claims, 10 Drawing Sheets

U.S. PATENT DOCUMENTS

| | | | |
|---|---|---|---|
| 5,744,822 | A | 4/1998 | Takayama et al. |
| 5,757,456 | A | 5/1998 | Yamazaki et al. |
| 5,811,328 | A | 9/1998 | Zhang et al. |
| 5,821,138 | A | 10/1998 | Yamazaki et al. |
| 5,834,327 | A | 11/1998 | Yamazaki et al. |
| 5,841,180 | A | 11/1998 | Kobayashi et al. |
| 5,936,231 | A | 8/1999 | Michiyama et al. |
| 5,955,726 | A | 9/1999 | Takashima et al. |
| 6,002,157 | A | 12/1999 | Kozuka |
| 6,087,648 | A | 7/2000 | Zhang et al. |
| 6,118,502 | A | 9/2000 | Yamazaki et al. |
| 6,124,155 | A | 9/2000 | Zhang et al. |
| 6,166,399 | A | 12/2000 | Zhang et al. |
| 6,194,740 | B1 | 2/2001 | Zhang et al. |
| 6,198,133 | B1 | 3/2001 | Yamazaki et al. |
| 6,204,519 | B1 | 3/2001 | Yamazaki et al. |
| 6,236,063 | B1 | 5/2001 | Yamazaki et al. |
| 6,243,155 | B1 | 6/2001 | Zhang et al. |
| 6,274,861 | B1 | 8/2001 | Zhang et al. |
| 6,287,888 | B1 | 9/2001 | Sakakura et al. |
| 6,335,213 | B1 | 1/2002 | Zhang et al. |
| 6,350,981 | B1 | 2/2002 | Uno |
| 6,376,333 | B1 | 4/2002 | Yamazaki et al. |
| 6,399,933 | B2 | 6/2002 | Zhang et al. |
| 6,424,326 | B2 | 7/2002 | Yamazaki et al. |
| 6,462,806 | B2 | 10/2002 | Zhang et al. |
| 6,496,240 | B1 | 12/2002 | Zhang et al. |
| 6,531,711 | B2 | 3/2003 | Sakakura et al. |
| 6,583,439 | B2 | 6/2003 | Yamazaki et al. |
| 6,639,262 | B2 * | 10/2003 | Paz de Araujo et al. ..... 257/295 |
| 6,680,764 | B2 | 1/2004 | Zhang et al. |
| 6,734,907 | B1 | 5/2004 | Hagihara et al. |
| 6,747,638 | B2 | 6/2004 | Yamazaki et al. |
| 6,784,411 | B2 | 8/2004 | Zhang et al. |
| 6,809,718 | B2 | 10/2004 | Wei et al. |
| 6,814,832 | B2 | 11/2004 | Utsunomiya |
| 6,822,211 | B2 | 11/2004 | Hagihara |
| 6,828,951 | B2 | 12/2004 | Yamazaki et al. |
| 6,858,898 | B1 | 2/2005 | Hayakawa et al. |
| 6,864,950 | B2 | 3/2005 | Zhang et al. |
| 6,867,752 | B1 | 3/2005 | Yamazaki et al. |
| 6,891,391 | B2 | 5/2005 | Hiroki |
| 6,930,326 | B2 | 8/2005 | Kato et al. |
| 6,937,306 | B2 | 8/2005 | Zhang et al. |
| 6,982,406 | B2 | 1/2006 | Chen |
| 6,995,753 | B2 | 2/2006 | Yamazaki et al. |
| 6,998,282 | B1 | 2/2006 | Yamazaki et al. |
| 7,030,551 | B2 | 4/2006 | Yamazaki et al. |
| 7,046,282 | B1 | 5/2006 | Zhang et al. |
| 7,050,138 | B1 | 5/2006 | Yamazaki et al. |
| 7,173,279 | B2 | 2/2007 | Yamazaki et al. |
| 7,286,173 | B2 | 10/2007 | Zhang et al. |
| 2001/0030704 | A1 | 10/2001 | Kimura |
| 2001/0038065 | A1 | 11/2001 | Kimura |
| 2002/0011978 | A1 | 1/2002 | Yamazaki et al. |
| 2002/0012057 | A1 | 1/2002 | Kimura |
| 2002/0042171 | A1 | 4/2002 | Zhang et al. |
| 2002/0044208 | A1 | 4/2002 | Yamazaki et al. |
| 2002/0074551 | A1 | 6/2002 | Kimura |
| 2002/0127785 | A1 | 9/2002 | Zhang et al. |
| 2002/0130322 | A1 | 9/2002 | Zhang et al. |
| 2003/0032210 | A1 | 2/2003 | Takayama et al. |
| 2003/0032213 | A1 | 2/2003 | Yonezawa et al. |
| 2003/0071953 | A1 | 4/2003 | Yamazaki et al. |
| 2003/0134048 | A1 | 7/2003 | Shiotsuka et al. |
| 2003/0166336 | A1 | 9/2003 | Kato et al. |
| 2003/0201450 | A1 | 10/2003 | Yamazaki et al. |
| 2003/0217805 | A1 | 11/2003 | Takayama et al. |
| 2004/0079941 | A1 | 4/2004 | Yamazaki et al. |
| 2004/0121602 | A1 | 6/2004 | Maruyama et al. |
| 2004/0217357 | A1 | 11/2004 | Zhang et al. |
| 2004/0263712 | A1 | 12/2004 | Yamazaki et al. |
| 2005/0029518 | A1 | 2/2005 | Kato et al. |
| 2005/0052584 | A1 | 3/2005 | Yamazaki et al. |
| 2005/0056842 | A1 | 3/2005 | Nishi et al. |
| 2005/0070038 | A1 | 3/2005 | Yamazaki et al. |
| 2005/0082463 | A1 | 4/2005 | Koyama et al. |
| 2005/0161675 | A1 | 7/2005 | Kimura |
| 2005/0162421 | A1 | 7/2005 | Yamazaki et al. |
| 2005/0162578 | A1 | 7/2005 | Yamazaki et al. |
| 2005/0167573 | A1 | 8/2005 | Maruyama et al. |
| 2005/0195129 | A1 | 9/2005 | Yamazaki et al. |
| 2005/0202609 | A1 | 9/2005 | Zhang et al. |
| 2005/0206830 | A1 | 9/2005 | Zhang et al. |
| 2006/0082568 | A1 | 4/2006 | Yamazaki et al. |
| 2007/0114532 | A1 | 5/2007 | Yamazaki et al. |
| 2007/0126904 | A1 | 6/2007 | Kimura |
| 2007/0267665 | A1 | 11/2007 | Koyama et al. |
| 2007/0290246 | A1 | 12/2007 | Zhang et al. |

FOREIGN PATENT DOCUMENTS

| | | |
|---|---|---|
| JP | 56-048184 A | 5/1981 |
| JP | 63-114164 A | 5/1988 |
| JP | 01-289381 A | 11/1989 |
| JP | 02-280373 A | 11/1990 |
| JP | 06-045354 | 2/1994 |
| JP | 06-275808 | 9/1994 |
| JP | 07-086607 | 3/1995 |
| JP | 08-064795 | 3/1996 |
| JP | 08-250745 | 9/1996 |
| JP | 08-264796 | 10/1996 |
| JP | 08-288522 | 11/1996 |
| JP | 09-036340 A | 2/1997 |
| JP | 11-097690 A | 4/1999 |
| JP | 11-243209 | 9/1999 |
| JP | 2001-320547 | 11/2001 |
| JP | 2002-062856 | 2/2002 |
| JP | 2002-176162 | 6/2002 |
| JP | 3329512 | 7/2002 |
| JP | 3329512 | 9/2002 |
| JP | 2002-303676 A | 10/2002 |
| JP | 2002-305297 | 10/2002 |
| JP | 2003-047017 | 2/2003 |
| JP | 2003-060744 | 2/2003 |
| JP | 2003-174153 | 6/2003 |

OTHER PUBLICATIONS

"Amorphous Silicon Semiconductor Visible-light Sensors"; *TDK Home page*—www.tdk.co.jp; 7 pages & full English language translation; Jun. 2002.

"Developing a Thin and High Output Visible Light Sensor Using a Plastic Substrate"; *TDK Home page*—www.tdk.co.jp; 3 pages & full English language translation; Oct. 2003.

"Thin and High Output Visible Light Sensor"; Kagaku Kougyou Shinbun; 1 page & full English language translation; Oct. 2003.

"Bring About High Output and Downsizing"; *The Nikkan Kogyo Shimbun, Ltd.*; 1 page & full English language translation; Oct. 2003.

"A Visible Light Sensor and an Amplifier Circuit Succeeded in Forming Them Within the Size of 2x1.5 mm on a Plastic Chip", *Denpa Shinbun*; 1 page & full English language translations; Oct. 2003.

"Amorphous Silicon Semiconductor Optical Sensors for Brightness Adjustment, Control of the Lighting Systems, etc., BCS Series", *TDK Home page*—www.tdk co.jp; 7 pages & full English language translation; Jun. 2002.

"Developing a Thin and High Output Visible Light Sensor Using a Plastic Substrate", *TDK Home page* (Press Release)—www. tdk.co.jp; 3 pages & full English language translation; Oct. 2003.

* cited by examiner

SEMICONDUCTOR DEVICE AND METHOD OF MANUFACTURING THE SAME

TECHNICAL FIELD

The present invention relates to a semiconductor device having a sensor element and a circuit comprising a thin film transistor (hereinafter called a TFT), and a manufacturing method thereof.

It is to be noted that a semiconductor device means any device which can function by utilizing semiconductor characteristics, and an electro-optical device, a semiconductor circuit, and an electronic apparatus are all included in the semiconductor device in this specification.

BACKGROUND

Conventionally, as a solid-state imaging element, there has been a sensor element using a single crystalline silicon substrate and a sensor element using an amorphous silicon film.

A characteristic of the sensor element using a single crystalline silicon substrate is that high output is achieved by forming an output amplifier circuit over the single crystalline silicon substrate and integrating it with the sensor element. However, the form of a completed packaged unit is not slim since a correction filter for wavelength sensitivity is required. In addition, the sensor element using a single crystalline silicon substrate has a problem in that the range of variations is increased by using a filter or the like.

On the other hand, a characteristic of the sensor element using an amorphous silicon film is in that a correction filter such as an infrared light cut filter is not required since the wavelength sensitivity is close to that of human eyes, while there is a limit since an output value of the sensor element is not amplified. In addition, it is easily affected by noise of other signals or the like since the output value of the sensor element is small. The output value of the sensor element depends on the absolute amount of the sensor element (e.g., area, thickness, etc.). Therefore, in order to increase the output value of the sensor element using an amorphous silicon film, the area thereof was required to be increased accordingly.

It is possible to use by amplifying the output of the sensor element using an amorphous film by providing an operational amplifier externally to the sensor element using an amorphous film. In this case, however, there was another problem that the number of external parts is increased and the sensor circuit becomes large.

The photosensitivity of the sensor element using an amorphous film is lower than half of that of the sensor element using a single crystalline silicon substrate. Therefore, there is a problem that a display device requiring a large area such as a liquid crystal projector is further easily affected by noise. Since a shield for covering a wire and the like are necessary in order to use the sensor element using an amorphous film in the large display device, cost of the display device increased.

The present inventor has suggested Patent Documents 1 to 4 concerning a semiconductor device having a sensor element and a circuit comprising a TFT over a glass substrate.

[Patent Document 1] Japanese Patent Laid-Open No. Hei6-275808

[Patent Document 2] Japanese Patent Laid-Open No. 2001-320547

[Patent Document 3] Japanese Patent Laid-Open No. 2002-62856

[Patent Document 4] Japanese Patent Laid-Open No. 2002-176162

DISCLOSURE OF THE INVENTION

Problems to Be Solved by the Invention

It is an object to form a plurality of elements in a limited area, reduce the area occupied by the element, and integrate the elements, considering further promotion of high output and miniaturization of a sensor element.

It is another object of to provide a process which improves the yield of a sensor element.

When each of the sensor element using a single crystalline silicon substrate and the sensor element using an amorphous silicon film has smaller size, the region for mounting parts becomes smaller accordingly. Therefore, in the case of mounting by soldering, for example, it is difficult to ensure the fixing strength. In the case where a region for fixing is small and the degree of hardness of the sensor element (which means the mechanical strength of the single crystalline silicon substrate, the glass substrate, or the like) is high, when bending stress is applied to the parts, the stress is not alleviated flexibly and therefore the parts may not be fixed firmly any more because of balance between the fixing strength and the mechanical stress.

In view of the foregoing, it is also an object of the present invention to achieve a sensor element having high resistance against bending stress by using a flexible substrate as a substrate.

Means for Solving the Problems

According to the present invention, a sensor element using an amorphous silicon film and an output amplifier circuit comprising a thin film transistor are integrated over a substrate having an insulating surface. Since high output can be achieved by the output amplifier circuit, a light receiving area of the sensor element can be reduced and further miniaturization can be achieved. In addition, since the light sensor element and the amplifier circuit are directly connected to each other over the same substrate, it has a characteristic that noise is not easily superposed.

It is to be noted that the present invention in which the sensor element using an amorphous silicon film and the output amplifier circuit comprising a thin film transistor are integrated has a characteristic in a connecting portion between the sensor element and the output amplifier circuit. The characteristic is a structure in which a metal layer is provided between a photoelectric conversion layer and a wire connecting to the thin film transistor in order to protect the exposed wire when the photoelectric conversion layer of the sensor element is patterned. It is to be noted that this metal layer functions as one electrode (a first electrode) of the sensor element.

That is, after forming a wire (e.g., a source wire, a drain wire, a connecting wire, etc.) which is electrically connected to a semiconductor layer of the thin film transistor, a metal layer is formed and patterned so as to cover the top and side surfaces of the wire. Then, a photoelectric conversion layer is formed so as to partially contact and overlap the wire and the metal layer. According to the present invention, damage to the wire due to etching of the photoelectric conversion layer can be protected and the yield is improved.

Furthermore, it is preferable that the wire which is electrically connected to the semiconductor layer of the thin film transistor is structured by stacked layers (having two or more layers) having a metal layer using a low resistance conductive material such as aluminum as a main component, as one layer thereof.

In addition, according to the present invention, in a light receiving region of the sensor element having a pair of electrodes, a first electrode is provided not to overlap the whole area of the light receiving region, but to overlap only a part of the light receiving region. As a result of this, the more amount of light is absorbed in the photoelectric conversion layer. Consequently, almost all the light incident into the photoelectric conversion layer does not transmit through the metal layer (the first electrode), but transmits through only an interlayer insulating film, a base insulating film, and a film substrate or a glass substrate to reach the photoelectric conversion layer. It is to be noted that a second electrode which is provided so as to oppose to the first electrode is provided all over the light receiving region of the sensor element. In the case where the photoelectric conversion layer has a multilayer structure including a p-type semiconductor layer or an n-type semiconductor layer as one layer, the p-type semiconductor layer or the n-type semiconductor layer also functions as an electrode; however, neither the p-type semiconductor layer nor the n-type semiconductor layer is referred to as the first electrode or the second electrode herein.

The semiconductor device of the present invention can function as a light sensor. The light incident into a diode (a photodiode) is absorbed in the photoelectric conversion layer and forms a photoelectric charge. The amount of the photoelectric charge formed by this light depends on the amount of light absorbed in the photoelectric conversion layer. The photoelectric charge formed by light is amplified by the circuit comprising a TFT and detected.

The diode used in the present invention is a Schottky diode in which a photoelectric conversion layer is sandwiched between a first electrode and a second electrode. It is to be noted herein that not only the diode with the above structure but also a PIN diode, a PN diode, an avalanche diode, or the like can be used as a photoelectric conversion element for converting light into an electrical signal.

For example, as another structure, the photoelectric conversion layer sandwiched between the first electrode and the second electrode may be a single layer which may be an i-type (intrinsic) semiconductor layer, a p-type semiconductor, or an n-type semiconductor. Alternatively, as another structure, the photoelectric conversion layer sandwiched between the first electrode and the second electrode may be two layers such as an i-type (intrinsic) semiconductor layer and an n-type semiconductor layer; an i-type (intrinsic) semiconductor layer and a p-type semiconductor layer; or a p-type semiconductor layer and an n-type semiconductor layer.

It is to be noted that a PIN photodiode is structured by a pair of electrodes, a p-type semiconductor layer, an n-type semiconductor layer, and an i-type (intrinsic) semiconductor layer sandwiched between the p-type semiconductor layer and the n-type semiconductor layer.

A structure of the present invention disclosed in this specification is a semiconductor device mounted with a small piece of a substrate having a light sensor element and an amplifier circuit on the same insulating surface. The amplifier circuit comprises an n-channel TFT having a semiconductor film having a crystalline structure. The light sensor element includes a first electrode covering top and side surfaces of a wire of the n-channel TFT, a p-type amorphous semiconductor layer partially contacting the first electrode over the wire and the first electrode, an i-type semiconductor layer having an amorphous structure on the p-type amorphous semiconductor layer, an n-type amorphous semiconductor layer on the i-type semiconductor layer, and a second electrode on the n-type amorphous semiconductor layer.

It is to be noted that the p-type semiconductor layer, the n-type semiconductor layer, and the i-type (intrinsic) semiconductor layer are not limited to an amorphous semiconductor film, and a crystalline semiconductor film such as a microcrystalline semiconductor film (also called a microcrystal semiconductor film) may be used as well.

Another structure of the present invention is a semiconductor device mounted with a small piece of a substrate having a light sensor element and an amplifier circuit on the same insulating surface. The amplifier circuit comprises an n-channel TFT having a semiconductor film with a crystalline structure. The light sensor element includes a first electrode covering top and side surfaces of a wire of the n-channel TFT, a p-type crystalline semiconductor layer partially contacting the first electrode over the wire and the first electrode, an i-type semiconductor layer having an amorphous structure on the p-type crystalline semiconductor layer, an n-type crystalline semiconductor layer on the i-type semiconductor layer, and a second electrode on the n-type crystalline semiconductor layer.

The contained concentration of impurities imparting n-type or p-type conductivity can be increased by using a microcrystalline semiconductor film, thereby an electric resistance value of the film can be decreased.

In addition, as the p-type semiconductor layer, the n-type semiconductor layer, and the i-type (intrinsic) semiconductor layer, a semiconductor material obtained by a low-pressure thermal CVD method, a plasma CVD method, a sputtering method, or the like, such as silicon or an alloy of silicon-germanium ($Si_{1-X}Ge_X$(X=0.0001~0.02)) can be used.

It is to be noted in this specification that a crystalline semiconductor film is a kind of a semiconductor film having a crystalline structure and means a film having crystal grains each having a size of about several nm~50 nm. For simplicity, a film having crystal grains each having a size of more than 50 nm is referred to as a semiconductor film having a crystalline structure. Further, an amorphous semiconductor film mixed with crystal grains each having a size of about several mn~50 nm is also referred to as a crystalline semiconductor film.

In addition, in each of the above-described structures, a p-channel TFT can be used instead of the n-channel TFT.

In addition, in each of the above-described structures, an external terminal provided for a chip has a two-terminal structure. Therefore, the number of pins is small similarly to that in a conventional stand-alone amorphous visible light sensor, and sensing of visible light can be performed with less mounting portions.

It is to be noted in this specification that a chip provided with the light sensor element and the amplifier circuit does not mean a chip using a semiconductor substrate, but means a small piece of a plastic substrate or a glass substrate provided with the light sensor element and the amplifier circuit.

In addition, in each of the above-described structures, the first electrode is a film containing Ti, and the wire of the n-channel TFT has a three-layer structure of a first film containing Ti, a film containing aluminum, and a second film containing Ti. By employing the common material, a good ohmic contact can be obtained between the wire of the n-channel TFT and the first electrode. The wire of the n-channel TFT functions as a source wire, a drain wire, or a connecting wire which is formed in the same step. Thus, a wire for connecting a gate electrode of the n-channel TFT to the first electrode also has the three-layer structure of the first film containing Ti, the film containing aluminum, and the second film containing Ti.

Further, when the wire of the n-channel TFT has the three-layer structure of the first film containing Ti, the film containing aluminum, and the second film containing Ti, in the case where the first film containing Ti contacts the semiconductor layer, aluminum atoms can be prevented from being diffused into the channel forming region and the second film containing Ti prevents surface oxidation of the film containing aluminum. In addition, the second film containing Ti prevents occurrence of a protrusion such as a hillock or a whisker in the film containing aluminum.

It is to be noted that the first electrode and the wire of the TFT are not limited to Ti and another metal such as Mo may be used; and for example, the first electrode may be a layer containing Mo and the wire of the n-channel TFT may have a three-layer structure of a first film containing Mo, a film containing aluminum, and a second film containing Mo.

In addition, in each of the above-described structures, the second electrode is patterned so as to partially overlap the first electrode and the wire. Disconnection is prevented by partially overlapping the second electrode with the first electrode and the wire.

In addition, another characteristic of the present invention is that a second electrode, a terminal electrode, or a sealing layer is formed by screen printing in order to shorten the time for a step after a photoelectric conversion layer is formed. It is to be noted that the electrode (the second electrode or the terminal electrode) formed by the screen printing is formed of a conductive material containing a resin.

In addition, in each of the above-described structures, the light sensor element and the amplifier circuit are provided over a glass substrate or a plastic substrate.

In addition, the present invention has another characteristic that high output and miniaturization are achieved by forming an output amplifier circuit comprising a TFT having a semiconductor film with a crystalline structure (typically a polysilicon film) as an active layer and a sensor element using an amorphous semiconductor film (typically an amorphous silicon film) over a heat-resistant plastic film substrate that can resist the temperature in the mounting process such as solder reflow treatment.

It is to be noted that in order to form over a plastic film substrate, an output amplifier circuit and a sensor element formed over a glass substrate are peeled off from the glass substrate and then transferred onto the plastic film substrate by using a peeling and transferring technique. Alternatively, the output amplifier circuit and the sensor element may be formed directly over a heat-resistant plastic substrate that can resist the temperature (about 250° C.) in the mounting process such as solder reflow treatment. However, in the case where the output amplifier circuit and the sensor element are formed directly over the heat-resistant plastic substrate, it is necessary to perform the manufacturing process of the output amplifier circuit and the sensor element within the temperature range where the substrate can resist. For example, an HT substrate (manufactured by Nippon Steel Chemical Co., Ltd) having a Tg of 400° C. or higher is raised as the heat-resistant plastic substrate. The HT substrate also has high transparency (a transmittance of 90% or more for a wavelength of 400 nm) and a low thermal expansion characteristic (CTE<48 ppm).

Laser process can be performed if the sensor element is formed over a plastic substrate, thereby a minimal size can be achieved which is difficult to be cut in the case of a single crystalline silicon substrate or a glass substrate.

Moreover, by using a plastic substrate, a sensor element having high resistance against bending stress can be achieved.

In addition, one of the present invention is to reduce the number of steps by forming a second electrode by a printing method and etching a photoelectric conversion layer in a self-aligned manner. The present invention of a manufacturing method is a manufacturing method of a semiconductor device mounted with a small piece of a substrate having a light sensor element and an amplifier circuit on the same insulating surface. The manufacturing method of the semiconductor device is characterized by comprising a first step of forming a wire which is connected to a thin film transistor constituting the amplifier circuit, a second step of forming a first electrode to cover top and side surfaces of the wire, a third step of stacking a first conductive type amorphous semiconductor film, an amorphous semiconductor film, and a second conductive type amorphous semiconductor film to cover the wire and the first electrode, a fourth step of forming a second electrode on the second conductive type amorphous semiconductor film by a printing method, and a fifth step of etching the first conductive type amorphous semiconductor film, the amorphous semiconductor film, and the second conductive type amorphous semiconductor film in a self-aligning manner using the second electrode as a mask.

In addition, it is also characterized in that a sixth step of forming a sealing layer to cover end portions of the first electrode and the second electrode by a printing method, and a seventh step of forming a third electrode on the sealing layer to contact the second electrode by a printing method are provided after the fifth step in addition to the above-described manufacturing method.

In addition, in the above-described manufacturing method, it is also characterized in that the second electrode in the fourth step is formed so as to partially overlap the wire and the first electrode.

It is to be noted that a resist mask for etching a photoelectric conversion layer may be formed by a printing method. Another structure of the present invention of a manufacturing method is a manufacturing method of a semiconductor device mounted with a small piece of a substrate having a light sensor element and an amplifier circuit over the same insulating surface. The manufacturing method of the semiconductor device is characterized by comprising a first step of forming a wire which connects to a thin film transistor constituting the amplifier circuit, a second step of forming a first electrode to cover top and side surfaces of the wire, a third step of stacking a first conductive type amorphous semiconductor film, an amorphous semiconductor film, and a second conductive type amorphous semiconductor film to cover the wire and the first electrode, a fourth step of forming a resist mask on the second conductive type amorphous semiconductor film by a printing method, a fifth step of etching the first conductive type amorphous semiconductor film, the amorphous semiconductor film, and the second conductive type amorphous semiconductor film by using the resist mask as a mask, a sixth step of removing the resist mask, and a seventh step of forming a second electrode on the second conductive type amorphous semiconductor film by a printing method.

In addition, it is also characterized in that an eighth step of forming a sealing layer to cover end portions of the first electrode and the second electrode by a printing method, and a ninth step of forming a third electrode on the sealing layer to contact the second electrode by a printing method are provided after the seventh step in addition to the above-described manufacturing method.

In addition, in the above-described manufacturing method, it is also characterized in that the second electrode in the seventh step is formed so as to partially overlap the wire and the first electrode.

In addition, according to the present invention, the sensor element and the amplifier circuit are transferred onto a plastic film substrate by using a peeling and transferring technique disclosed in Japanese patent Laid-Open No. 2003-174153 (a peeling method using a metal film (e.g., W, WN, Mo, etc.) and a silicon oxide film by a sputtering method). It is to be noted that the peeling and transferring technique is not limited to the technique disclosed in the above-described gazette and various techniques (e.g., a technique disclosed in Japanese patent Laid-Open No. Hei 08-288522, Hei 08-250745, or Hei 08-264796, namely a peeling technique for removing the peeling layer by dry etching or wet etching, etc.) may be used.

The present invention can be applied regardless of a TFT structure. For example, a top-gate TFT, a bottom-gate (inversely staggered) TFT, or a staggered TFT can be used. In addition, the TFT is not limited to have a single-gate structure and a multi-gate TFT having a plurality of channel forming regions, for example, a double-gate TFT may be used.

EFFECT OF THE INVENTION

By forming a visible light sensor and an amplifier circuit comprising a TFT over the same substrate, it is possible to reduce the cost, the volume of the parts due to reduction in thickness, and the area for mounting, and besides, noise superposition can be reduced.

By forming a visible light sensor by a sensor element using an amorphous silicon film, an infrared light cut filter is not required and the visible light sensor can be a sensor element having a reduced output variation. Furthermore, output current can be increased and a variation can be suppressed by the amplifier circuit comprising a TFT formed over the same substrate as the visible light sensor. The light receiving area can be reduced because of output amplification by the amplifier circuit, thereby reduction in size and weight of a mounted set, and reduction of the number of components can be achieved.

BEST MODE FOR CARRYING OUT THE INVENTION

Embodiment modes of the present invention are described below.

Embodiment Mode 1

FIG. 1(A) is a cross-sectional view of a mounted light sensor chip of the present invention. FIG. 1A shows an example of a visible light sensor chip (2.0 mm×1.5 mm) having two terminals. In FIG. 1A, reference numeral 10 denotes a glass substrate, reference numeral 12 denotes a base insulating film, and reference numeral 13 denotes a gate insulating film. Since received light passes through the glass substrate 10, the base insulating film 12, and the gate insulating film 13, these are preferably formed of a material having high transmittance.

A PIN photodiode 25 is structured by a first electrode 18, a second electrode 23, a p-type semiconductor layer 21$p$, an n-type semiconductor layer 21$n$, and an i-type (intrinsic) semiconductor layer 21$i$ sandwiched between the p-type semiconductor layer and the n-type semiconductor layer.

A wire 19 has a stacked layer structure of a high melting point metal film and a low resistance metal film (e.g., an aluminum alloy, pure aluminum, etc.). Herein, the wire 19 has a three-layer structure in which a Ti film, an Al film, and a Ti film are stacked in this order. The first electrode 18 is formed so as to cover the wire 19. Further, the second electrode 23 is provided so as to partially overlap the first electrode 18 with a photoelectric conversion layer structured by the p-type semiconductor layer 21$p$, the n-type semiconductor layer 21$n$, and the i-type semiconductor layer 21$i$ sandwiched therebetween.

When the photoelectric conversion layer is etched, the wire 19 is protected by the first electrode 18 which covers it. A material of the first electrode 18 is preferably a conductive material whose etching rate against an etching gas (or an etchant) of the photoelectric conversion layer is smaller than that of the photoelectric conversion layer, and besides, the conductive material preferably does not form an alloy by reacting with the photoelectric conversion layer. It is to be noted that FIG. 1A shows a case where end portions of the photoelectric conversion layer are etched to be inside end portions of the second electrode 23.

An amplifier circuit provided over the same substrate in order to amplify an output value of the PIN photodiode 25 is constituted by a current mirror circuit comprising n-channel TFTs 30 and 31. Although FIG. 1A illustrates two TFTs, actually two n-channel TFTs 30 (channel size L/W=8 μm/50 μm) and ten n-channel TFTs 31 (channel size L/W=8 μm/50 μm) are provided in order to increase the output value to be five times as large. Here, one n-channel TFT 30 and a hundred n-channel TFTs 31 are provided in order to increase the output value to be 100 times as large.

FIG. 1B is an equivalent circuit diagram of the visible light sensor chip having two terminals. Although FIG. 1B is an equivalent circuit diagram using an n-channel TFT, only a p-channel TFT may be used instead of the n-channel TFT.

In order to further amplify the output value, the amplifier circuit may be constituted by an operational amplifier (op-amp) in which an n-channel TFT or a p-channel TFT is combined arbitrarily. In this case, however, the number of terminals is five. Alternatively, by constituting the amplifier circuit by an operational amplifier and using a level shifter, the number of power sources can be reduced to four terminals.

Although a case where the n-channel TFTs 30 and 31 are top-gate TFTs having a single gate structure is shown, a double gate structure may be employed to reduce a variation of an on-current value. Furthermore, in order to reduce an off-current value, the n-channel TFTs 30 and 31 may have an LDD (Lightly Doped Drain) structure. The LDD structure is a structure in which a region with an impurity element added at low concentration which is referred to as an LDD region is provided between a channel forming region and a source region or a drain region formed by adding the impurity element at high concentration. The LDD structure has an advantageous effect of relaxing the electric field near the drain to prevent deterioration due to hot-carrier injection. Moreover, in order to prevent lowering of the on-current value due to the hot carrier, the n-channel TFTs 30 and 31 may have a GOLD (Gate-drain Overlapped LDD) structure. The GOLD structure, which is a structure in which an LDD region is overlapped with a gate electrode with a gate insulating film interposed therebetween, has an advantageous effect of further relaxing the electric field near the drain than the LDD structure to prevent deterioration due to hot-carrier injection. Thus, the GOLD structure is efficient in preventing the deterioration by relaxing the electric field intensity near the drain to prevent the hot-carrier injection.

A wire 14 is connected to the wire 19, and extends above a channel forming region of the TFT 30 of the amplifier circuit and therefore the wire also functions as a gate electrode.

A wiring 15 is connected to the second electrode 23 and to a drain wire (also called a drain electrode) or a source wire (also called a source electrode) of the TFT 31. Moreover, reference numerals 16 and 17 denote inorganic insulating films, and reference numeral 20 denotes a connection electrode. Since received light passes through the inorganic insulating films 16 and 17, these are preferably formed of a material having high light transmittance. It is to be noted that as the inorganic insulating film 17, a $SiO_2$ film formed by a CVD method is preferably used. When the inorganic insulating film 17 is a $SiO_2$ film formed by a CVD method, the fixing strength is improved.

A terminal electrode 50 is formed in the same step as that of the wires 14 and 15. A terminal electrode 51 is formed in the same step as that of the electrodes 19 and 20.

A terminal electrode 26 is connected to the second electrode 23 and is mounted over an electrode 61 of a printed wiring board 60 by solder 64. On the other hand, a terminal electrode 53 is formed in the same step as that of the terminal electrode 26 and is mounted over an electrode 62 of the printed wiring board 60 by solder 63.

Manufacturing steps for obtaining the above-described structure are described below with reference to FIG. 2.

First, an element is formed over a glass substrate (the first substrate 10). AN 100 is used as the glass substrate here.

Then, a silicon oxynitride film (a thickness of 100 nm) is formed as the base insulating film 12 by a PCVD method. After that, without exposing it to the atmosphere, an amorphous silicon film containing hydrogen (a thickness of 54 nm) is stacked. The base insulating film 12 may be a stacked layer using a silicon oxide film, a silicon nitride film, and a silicon oxynitride film. It is to be noted that the silicon oxynitride film and the silicon nitride film function as a blocking layer for preventing impurities such as an alkali metal from diffusing from the glass substrate.

Next, the above-described amorphous silicon film is crystallized by a known technique (e.g., a solid phase crystallization method, a laser crystallization method, a crystallization method using a catalyst metal, etc.), thereby an element using a TFT having a polysilicon film as an active layer is formed. Herein, the polysilicon film is formed by the crystallization method using a catalyst metal. A nickel acetate solution containing nickel by 10 ppm in weight is applied by a spinner. Alternatively, a nickel element may be sprayed to the whole surface of the above amorphous silicon film by a sputtering method instead of the coating method. Then, the amorphous silicon film is crystallized by performing heating treatment to form a semiconductor film having a crystalline structure (a polysilicon layer herein). Herein, after thermal treatment (for one hour at a temperature of 500° C.), thermal treatment (for four hours at a temperature of 550° C.) for the crystallization is performed to form the silicon film having the crystalline structure.

Next, after removing an oxide film on the surface of the silicon film having the crystalline structure by dilute hydrofluoric acid or the like, laser light (XeCl: wavelength 308 nm) is irradiated in the atmosphere or an oxygen atmosphere in order to increase the degree of crystallinity and repair a defect left in crystal grains. Excimer laser light having a wavelength of 400 nm or shorter, a second harmonic or a third harmonic of a YAG laser is used. Pulsed laser light having a repetition rate of about 10~1000 Hz is irradiated and scanned on a surface of the silicon film in such a way that the laser light is condensed by an optical system so as to have an energy density of 100~500 $mJ/cm^2$ and that the overlap rate is set at 90~95%. Herein, the repetition rate is 30 Hz and the energy density is 470 $mJ/cm^2$ when the laser light irradiation is performed in the atmosphere. It is to be noted that an oxide film is formed on the surface of the silicon film because the laser light irradiation is performed in the atmosphere or the oxygen atmosphere. Although description is made on the case where the pulsed laser is used, a continuous wave laser may be used as well. In order to obtain crystals having a large grain size, the amorphous semiconductor film is preferably crystallized by a continuous wave solid-state laser applying second to fourth harmonics of a fundamental wave. Typically, a second harmonic (532 nm) or a third harmonic (355 nm) of an $Nd:YVO_4$ laser (the fundamental wavelength is 1064 nm) may be applied. In the case of using the continuous wave laser, laser light emitted from the continuous wave $YVO_4$ laser having an output of 10 W is converted into the harmonic by a non-linear optical element. The harmonic may also be emitted by setting $YVO_4$ crystals and a non-linear optical element in a resonator. It is preferable to shape the laser light into rectangular or elliptical shape on the irradiated surface by an optical system to be irradiated to a processing object. The energy density required in this case is about 0.01~100 $MW/cm^2$ (preferably 0.1~10 $MW/cm^2$). Then, the laser light may be irradiated to the semiconductor film while moving the semiconductor film relative to the laser light at a speed of about 10~2000 cm/s.

Subsequently, in addition to the oxide film formed by the above-described laser light irradiation, the surface is processed using ozone water for 120 seconds to form a barrier layer constituted by an oxide film having a total thickness of 1~5 nm. This barrier layer is formed in order to remove nickel added for the crystallization from the silicon film. Although the barrier layer is formed using the ozone water herein, the barrier layer may be formed by depositing an oxide film having a thickness of about 1~10 nm by a method in which the surface of the semiconductor film having the crystalline structure is oxidized by irradiating ultraviolet ray in an oxygen atmosphere; a method in which the surface of the semiconductor film having the crystalline structure is oxidized by oxygen plasma treatment; a plasma CVD method; a sputtering method; a vapor deposition method, or the like. It is to be noted that the oxide film formed by the laser irradiation may be removed before the barrier layer is formed.

Subsequently, an amorphous silicon film containing an argon element which functions as a gettering site is formed on the barrier layer with a thickness of 10~400 nm (a thickness of 100 nm herein) by a sputtering method. Herein, the amorphous silicon film containing an argon element is formed in an atmosphere containing argon using a silicon target. In the case where the amorphous silicon film containing an argon element is formed using a plasma CVD method, the film-forming condition is set such that the flow ratio of monosilane and argon ($SiH_4:Ar$) is 1:99, the film-forming pressure is 6.665 Pa (0.05 Torr), the RF power density is 0.087 $W/cm^2$, and the film-forming temperature is 350° C.

After that, gettering is performed by thermal treatment for three minutes in a furnace at a temperature of 650° C. so that the nickel concentration in the semiconductor film having the crystalline structure is decreased. It is to be noted that a lamp annealing apparatus may be used instead of the furnace.

Next, after selectively removing the amorphous silicon film containing an argon element functioning as a gettering site by using the barrier layer as an etching stopper, the barrier layer is selectively removed by dilute hydrofluoric acid. It is to be noted that since nickel is likely to move to the region where the oxygen concentration is high in the gettering process, the barrier layer constituted by the oxide film is preferably removed after the gettering.

If the semiconductor film is not crystallized using a catalyst element, the above-described steps of forming the barrier layer, forming the gettering site, performing the thermal treatment for the gettering, removing the gettering site, removing the barrier layer, and the like are not required.

Subsequently, after a thin oxide film is formed using ozone water on a surface of the obtained silicon film having the crystalline structure (also called a polysilicon film), a resist mask is formed using a first photo mask, and etching treatment is performed to obtain a desired shape so that an island-shaped semiconductor layer is formed. After the island-shaped semiconductor layer is formed, the resist mask is removed.

Then, a small amount of an impurity element (boron or phosphorus) is added in order to control the threshold value of the TFT if necessary. An ion doping method is performed herein in which diborane ($B_2H_6$) is plasma-excited without mass-separation.

Next, after removing the oxide film as well as cleaning the surface of the silicon film by an etchant containing hydrofluoric acid, an insulating film containing silicon as a main component is formed as the gate insulating film 13. Herein, a silicon oxynitride film (a composition ratio: Si=32%, O=59%, N=7%, H=2%) is formed with a thickness of 115 nm by a plasma CVD method.

Subsequently, after forming a metal film on the gate insulating film, patterning is performed using a second photo mask to form the gate electrode, the wires 14 and 15, and the terminal electrode 50. Then, doping is performed to the active layer to form a source region and a drain region of the TFT.

Then, after a first interlayer insulating film (not shown) constituted by a silicon oxide film is formed with a thickness of 50 nm by a CVD method, a step of activating the impurity element added in each semiconductor layer is performed. This activation step is performed by a rapid thermal annealing (RTA) method using a lamp light source, a method in which YAG laser or excimer laser is irradiated from the back surface, thermal treatment using a furnace, or a combination of theses methods.

Next, a step of hydrogenating the semiconductor layer is performed by forming the second interlayer insulating film 16 constituted by a silicon nitride oxide film containing hydrogen and performing thermal treatment (for 1~12 hours at a temperature of 300~550° C.). This process is to terminate a dangling bond in the semiconductor layer by using the hydrogen contained in the second interlayer insulating film 16. The semiconductor layer can be hydrogenated regardless of the existence of the insulating film 13 constituted by the silicon oxide film.

Subsequently, on the second interlayer insulating film 16, the third interlayer insulating film 17 is formed of an insulator material. An insulating film having a siloxane structure formed by a coating method or an inorganic insulating film formed by a CVD method can be used as the third interlayer insulating film 17. Herein, a silicon oxide film is formed in order to improve adhesion.

Then, a resist mask is formed using a third photo mask and the interlayer insulating films 16 and 17 or the gate insulating film 13 is selectively etched to form a contact hole. The resist mask is then removed.

Subsequently, after forming a metal stacked layer film by a sputtering method, a resist mask is formed using a fourth photo mask and the metal stacked layer film is selectively etched to form the wire 19, the connection electrode 20, the terminal electrode 51, and the source electrode and the drain electrode of the TFT. The resist mask is then removed. It is to be noted that the metal stacked layer film is a stacked layer of three layers of a Ti film with a thickness of 100 nm, an Al film containing a slight amount of Si with a thickness of 350 nm, and a Ti film with a thickness of 100 nm.

Through the above-described steps, the top-gate TFTs 30 and 31 having the polysilicon film as the active layer are manufactured.

Next, after forming a conductive metal film (e.g., Ti, Mo, etc.) which does not easily form an alloy by reacting with a photoelectric conversion layer (typically amorphous silicon) formed later, a resist mask is formed using a fifth photo mask and the conductive metal film is selectively etched to form the first electrode 18 to cover the wire 19 (FIG. 2A) Used herein is a Ti film with a thickness of 200 nm formed by a sputtering method. It is to be noted that the connection electrode 20, the terminal electrode 51, the source electrode and the drain electrode of the TFT are covered with the conductive metal film as well. Therefore, the conductive metal film also covers a side surface where the Al film which is the second layer of each electrode is exposed, and diffusion of the aluminum atoms into the photoelectric conversion layer can be prevented by the conductive metal film.

A cross-sectional view at this step, of a region different from FIG. 2A is shown in FIG. 5A. In FIG. 5A, the same portions are denoted by the same reference numerals as in FIG. 2A. It is to be noted that the TFT is not shown in FIG. 5A and only the wire 19 of the TFT is shown.

Subsequently, a p-type semiconductor layer, an i-type (intrinsic) semiconductor layer, and an n-type semiconductor layer are sequentially stacked as a photoelectric conversion layer. A cross-sectional view at this stage is shown in FIG. 5B.

As the p-type semiconductor layer, a p-type microcrystalline silicon film is formed with a thickness of 50 nm by a PCVD method in which the interval between electrodes is 32 mm, the film-forming pressure is 266 Pa, the RF power is 550 W, and a source gas is $SiH_4$(a flow rate of 4 sccm), $B_2H_6$ (a flow rate of 20 sccm), and $H_2$ (a flow rate of 773 sccm).

As the i-type (intrinsic) semiconductor layer, an i-type amorphous silicon film is formed with a thickness of 600 nm by a PCVD method in which the interval between electrodes is 36 mm, the film-forming pressure is 133 Pa, the RF power is 50~88 W, and a source gas is $SiH_4$ (a flow rate of 100 sccm) and $H_2$ (a flow rate of 1000 sccm).

As the n-type semiconductor layer, an n-type microcrystalline silicon film is formed with a thickness of 70 nm by a PCVD method in which the interval between electrodes is 36 mm, the film-forming pressure is 133 Pa, the RF power is 300 W, and a source gas is $SiH_4$ (a flow rate of 5 sccm), $PH_3$ (a flow rate of 30 sccm), and $H_2$ (a flow rate of 950 sccm).

Next, a metal film which is herein a Ti film with a thickness of 200 nm is formed. A cross-sectional view at this stage is shown in FIG. 5C. After that, a resist mask 90 is formed using a sixth photo mask. A cross-sectional view at this stage is shown in FIG. 5D. Then, the Ti film is etched to form the second electrode 23. A cross-sectional view at this stage is shown in FIG. 5E. Dry etching or wet etching can be employed; and herein, dry etching is performed using an ICP (Inductively Coupled Plasma) etching apparatus to etch the Ti film and the photoelectric conversion layer. A $Cl_2$ gas, a $CF_4$ gas, a $CF_4$ gas, an $NF_3$ gas, or an $SF_6$ gas may be arbitrarily used as an etching gas.

Etching is performed for ten seconds under the first etching condition that a mixed gas of a $Cl_2$ gas (a flow rate of 40 sccm) and a $CF_4$ gas (a flow rate of 40 sccm) is injected, the pressure is 1.2 Pa, and an RF (13.56 MHz) electric power of 450 W is applied to the coil electrode and an RF (13.56 MHz) electric power of 100 W is applied to the substrate side (a sample stage) to generate plasma. After that, etching is performed for eighty-eight seconds under a second etching condition that a $Cl_2$ gas (a flow rate of 80 sccm) is injected and the others are the same. It is to be noted that the size of the electrode area on the substrate side is 12.5 cm×12.5 cm, and the size of the electrode area of the coil electrode (a quartz disc provided with a coil herein) is 25 cm in diameter.

Through the above-described etching, the area of the second electrode 23 of one light sensor becomes 1.57 mm$^2$, which is approximately equal to the light receiving area. In addition, through the above-described etching, the photoelectric conversion layers (21$n$, 21$i$, and 21$p$) are etched in a horizontal direction and formed inside an end portion of the second electrode by about 1.5 μm. Although the end portion of the second electrode is projected according to this structure, it is within a range where a sealing layer can be formed at a subsequent step and therefore it is not particularly a problem. In addition, damage due to the above-described etching is protected by the first electrode 18 and a margin of the etching condition can be sufficiently secured by the existence of the first electrode 18. The resist mask is then removed. A cross-sectional view at this stage is shown in FIG. 5F.

Manufactured through the above-described steps is a photo diode having the first electrode 18, the photoelectric conversion layers 21$p$, 21$i$, and 21$n$ constituted by an amorphous silicon film or a microcrystalline silicon film, and the second electrode 23. A cross-sectional view at this stage is shown in FIG. 5F.

Next, a sealing layer 24 constituted by an insulator material film (an inorganic insulating film containing silicon) is formed with a thickness of (1~30 μm) on the whole surface to obtain a state of FIG. 2B. Herein, a SiON film is formed with a thickness of 1 μm by a CVD method as the insulator material film. The adhesion can be improved by using the inorganic insulating film formed by the CVD method. It is to be noted that a cross-sectional view at this step, of a region different from FIG. 2B is shown in FIG. 6A.

FIG. 3A is a cross-sectional SEM photograph corresponding to a portion surrounded by a chained line in FIG. 2B. A pattern diagram corresponding to FIG. 3A is shown in FIG. 3B. It is to be noted that the same portions as those in FIG. 1 and FIG. 2 are denoted by the same reference numerals in FIG. 3B. As shown in FIG. 3A and FIG. 3B, although the photoelectric conversion layer is formed inside due to the etching, the sealing layer 24 covers it.

Subsequently, a resist mask 91 is formed using an eighth photo mask. A cross-sectional view at this stage is shown in FIG. 6B. Then, the organic insulator material film is selectively etched to form a contact hole. A cross-sectional view at this stage is shown in FIG. 6C. The resist mask is then removed. A cross-sectional view at this stage is shown in FIG. 6D.

Then, the terminal electrodes 26 and 53 are formed by a sputtering method using a metal mask. Each of the terminal electrodes 26 and 53 is a stacked layer film of a Ti film (100 nm), a Ni film (300 nm), and an Au film (50 nm). The interval between the terminal electrode 26 and the terminal electrode 53 is preferably 0.3 mm or longer. The fixing strength of the terminal electrodes 26 and 53 exceeds 5 N, which is an enough fixing strength for a terminal electrode.

Through the above-described steps, the terminal electrodes 26 and 53 which can be connected by solder are formed and a structure shown in FIG. 2C can be obtained. It is to be noted that a cross-sectional view at this step, of a region different from FIG. 2C is shown in FIG. 6D. The light sensor and the amplifier circuit can be manufactured by eight photo masks and one metal mask, namely nine masks in total.

Subsequently, a plurality of light sensor chips is taken out by cutting. A large amount of light sensor chips (2 mm×1.5 mm) can be manufactured from one large-size substrate (e.g., 600 cm×720 cm).

FIG. 4A is a cross-sectional view of one taken light sensor chip (2 mm×1.5 mm), FIG. 4B is a bottom view thereof, and FIG. 4C is a top view thereof. FIG. 4D is a photograph of the appearance of the light sensor chip seen from above. In FIG. 4, the same portions are denoted by the same reference numerals as those in FIGS. 1 to 3. It is to be noted that the total thickness including the substrate 10, an element forming region 400, and the electrodes 26 and 53 is 0.8±0.05 mm in FIG. 4A.

In order to reduce the total thickness of the light sensor chip, the substrate 10 may be ground to be thin by CMP treatment or the like and then cut separately by a dicer to take out a plurality of light sensor chips.

In addition, in FIG. 4B, the size of each electrode of the terminal electrodes 26 and 53 is 0.6 mm×1.1 mm and the interval between the electrodes is 0.4 mm. In addition, in FIG. 4C, the area of a light receiving region 401 is 1.57 mm$^2$, which is approximately equal to the area of a second electrode. In an amplifier circuit region 402, about 100 TFTs are provided.

Finally, the obtained light sensor chip is mounted on a mounting surface of the printed wiring board 60. To connect the terminal electrodes 26 and 53 to the electrodes 61 and 62, solder is formed on the electrodes 61 and 62 of the printed wiring board 60 by a screen printing method or the like in advance. Then, after the solder and the terminal electrodes are connected to each other, solder reflow treatment is performed to mount. The solder reflow treatment is, for example, performed for about 10 seconds at a temperature of about 255~265° C. in an inert gas atmosphere. Alternatively, a bump made of a metal (gold, silver, etc.), a bump made of a conductive resin, or the like may be used instead of the solder. Further alternatively, lead-free solder may be used for mounting in consideration of an environmental problem.

FIG. 1A shows the light sensor chip mounted through the above-described steps. In the light sensor of the present invention (the light sensor integrated with the circuit where an amplifier circuit for amplifying the output value by 100 times is provided), a photoelectric current of about 10 μA can be obtained at an illuminance of 100 lux. In addition, the sensitivity wavelength range of the light sensor of the present invention is 350~750 nm and the peak sensitivity wavelength is 580 nm. A dark current (Vr=5 V) is 1000 pA.

Embodiment Mode 2

Described in this embodiment mode is a case where a part of the steps described in Embodiment Mode 1 is performed by screen printing. As for the same step as that of Embodiment Mode 1, specific description thereof is omitted for simplicity.

First, a TFT, a wire 19 of the TFT, and a terminal electrode 51 are formed over a glass substrate 10 similarly to Embodiment Mode 1.

Then, similarly to Embodiment Mode 1, after a conductive metal film (Ti or Mo) is formed, a resist mask is formed using a fifth photo mask and the conductive metal film is selectively etched to form a first electrode 18 which covers the wire 19. It is to be noted that a connection electrode, the terminal electrode 51, a source electrode and a drain electrode of the TFT are similarly covered with the conductive metal film.

Subsequently, similarly to Embodiment Mode 1, a p-layer (50 nm), a i-layer (600 nm), and a n-layer (70 nm) are formed to be stacked in this order using a CVD apparatus, thereby a total thickness of 720 nm is obtained.

Then, a second electrode 723 is formed by a screen printing method. (FIG. 7A)

The screen printing method is a transferring method of ink or paste, which is applied onto a screen plate in which a predetermined pattern is formed of a photosensitive resin on a base made of a metal or a high-molecular compound fiber mesh, onto a work provided on the opposite side of the screen plate by using a blade of rubber, plastic, or metal which is called a squeegee. The screen printing method has a merit in that pattern formation in a relatively large area can be achieved at low cost.

Herein, a screen printing machine is used and a Ni resin paste is used as the conductive material. Alternatively, a carbon (C) resin paste may be used as the conductive material. A printing condition is set such that a squeegee hardness is 900, a squeegee angle is 70°, a speed of the squeegee stroke is 50 mm/s, a scraper speed is 250 mm/s, a clearance is 1.8 mm, and a printing pressure is 0.25 MPa. It is to be noted that the clearance means an interval between the plate and the work. A heating condition is set at 200° C. for 30 minutes to perform hardening so that a thickness of 10±5 μm is obtained.

Subsequently, etching is performed in a self-aligned manner using the second electrode 723 as a mask to obtain a photoelectric conversion layer (a p-layer 721*p*, an i-layer 721*i*, and an n-layer 721*n*). Herein, dry etching is performed using a $CF_4$ gas.

Then, a sealing layer 724 is formed of a resin by a screen printing method. (FIG. 7B) In this step also, the screen printing machine is used and an insulating resin paste is used as the sealing material. A printing condition is set such that a squeegee hardness is 90°, a squeegee angle is 60°, a speed of the squeegee stroke is 50 mm/s, a scraper speed is 250 mm/s, a clearance is 1.8 mm, and a printing pressure is 0.18 MPa. A heating condition is set at 200° C. for 30 minutes to perform hardening so that a thickness of 28±5 μm is obtained.

Subsequently, third electrodes 725 and 752 are formed by a screen printing method. In this step also, the screen printing machine is used and the Ni resin paste or the carbon (C) resin paste is used as the conductive material. A printing condition is set such that a squeegee hardness is 90°, a squeegee angle is 70°, a speed of the squeegee stroke is 50 mm/s, a scraper speed is 250 mm/s, a clearance is 1.8 mm, and a printing pressure is 0.25 MPa. A heating condition is set at 200° C. for 30 minutes to perform hardening so that a thickness of 10±5 μm is obtained.

Then, terminal electrodes 726 and 753 are formed so as to contact and overlap the third electrodes by a screen printing method. A copper (Cu) resin paste is used as the conductive material. A printing condition is set such that a squeegee hardness is 90°, a squeegee angle is 60°, a speed of the squeegee stroke is 200 mm/s, a scraper speed is 250 mm/s, a clearance is 1.8 mm, and a printing pressure is 0.16 MPa. A heating condition is set at 160° C. for 30 minutes to perform hardening so that a thickness of 35±5 μm is obtained.

Through the above-described steps, the terminal electrodes 726 and 753 that can be soldered are formed and a structure shown in FIG. 7D can be obtained. Using five masks in total, a light sensor and an amplifier circuit can be manufactured.

Then, a plurality of light sensor chips is taken out by cutting separately. Finally, the obtained light sensor chip is mounted on the mounting surface of the printed wiring board.

This embodiment mode can be freely combined with Embodiment Mode 1.

Embodiment Mode 3

Described in this embodiment mode is a case where a resist formation is performed by screen printing. As for the same step as that of Embodiment Mode 1 or Embodiment Mode 2, specific description thereof is omitted for simplicity.

First, a TFT, a wire 19 of the TFT, and a terminal electrode 51 are formed over a glass substrate 10 similarly to Embodiment Mode 1.

Then, similarly to Embodiment Mode 1, after a conductive metal film (Ti or Mo) is formed, a resist mask is formed using a fifth photo mask and the conductive metal film is selectively etched to form a first electrode 18 which covers the wire 19. It is to be noted that a connection electrode, the terminal electrode 51, a source electrode and a drain electrode of the TFT are similarly covered with the conductive metal film.

Subsequently, similarly to Embodiment Mode 1, a p-layer (50 nm), an i-layer (600 nm), and a n-layer (70 nm) are formed to be stacked in this order using a CVD apparatus, thereby a total thickness of 720 nm is obtained.

Then, a resist 890 is formed by a screen printing method. (FIG. 8A) Herein, a printing machine (manufactured by Micro-Tech) is used and XR1051-3 is used as the resist material. A printing condition is set such that a squeegee hardness is 90°, a squeegee angle is 70°, a speed of the squeegee stroke is 50 mm/s, a scraper speed is 250 mm/s, a clearance is 1.8 mm, and a printing pressure is 0.25 MPa. A heating condition is set at 160° C. for 30 minutes to perform hardening so that a thickness of 15±5 μm is obtained.

Subsequently, etching is performed in a self-aligned manner using the resist 890 as a mask to obtain a photoelectric conversion layer (a p-layer 821*p*, an i-layer 821*i*, and an n-layer 821*n*). (FIG. 8B) Herein, dry etching is performed using a $CF_4$ gas.

The resist 890 is then removed. (FIG. 8C)

Subsequently, similarly to Embodiment Mode 2, a second electrode 823 is formed by a screen printing method (FIG. 8D). According to this embodiment mode, unlike Embodiment Modes 1 and 2, the second electrode 823 is formed after etching the photoelectric conversion layer, so that end portions of the second electrode 823 are formed inside end portions of the photoelectric conversion layer. In addition, according to this embodiment mode, the second electrode is not exposed to the etching gas when the photoelectric conversion layer is etched so that the photoelectric conversion layer is not formed inside from an edge of the second electrode, thereby good coverage at the subsequent step can be achieved.

Then, similarly to Embodiment Mode 2, a sealing layer 824 formed of a resin is formed by a screen printing method. (FIG. 8E)

Subsequently, similarly to Embodiment Mode 2, third electrodes 825 and 852 are formed by a screen printing method.

Then, terminal electrodes 826 and 853 are formed so as to contact and overlap the third electrodes by a screen printing method.

Through the above-described steps, the terminal electrodes 826 and 853 that can be soldered are formed and a structure shown in FIG. 8F can be obtained. Using five masks in total, a light sensor and an amplifier circuit can be manufactured.

Then, a plurality of light sensor chips is taken out by cutting separately. Finally, the obtained light sensor chip is mounted on the mounting surface of the printed wiring board.

This embodiment mode can be freely combined with Embodiment Mode 1 or Embodiment Mode 2.

Embodiment Mode 4

In this embodiment mode, description is made on a manufacturing method in which a light sensor and an amplifier circuit formed over a glass substrate are peeled off the glass substrate and then transferred onto a plastic substrate.

First, a metal film 902 is formed on a glass substrate 901. A single layer or a stacked layer formed of an element selected from W, Ti, Ta, Mo, Cr, Nd, Fe, Ni, Co, Zr, Zn, Ru, Rh, Pd, Os, and Ir or an alloy material or a compound material containing the above element as a main component can be used. Alternatively, a single layer or a stacked layer formed of nitride thereof such as titanium nitride, tungsten nitride, tantalum nitride, or molybdenum nitride can be used as well. The thickness of the nitride film or the metal film 902 is 10~200 nm, preferably 50~75 nm.

Next, an insulating film is formed on the metal film or the nitride film 902. At this time, an amorphous metal oxide film is formed between the metal film 902 and the insulating film with a thickness of about 2~5 nm. When peeling is performed at the subsequent step, the separation occurs within the metal oxide film, at an interface between the metal oxide film and the insulating film, or at an interface between the metal oxide film and the metal film. As the insulating film, a film is formed of silicon oxide, silicon oxynitride, and a metal oxide material by a sputtering method. It is desirable that the thickness of the insulating film be more than twice the thickness of the nitride film or the metal film 902, preferably 150~200 nm.

Subsequently, a film formed of a material containing at least hydrogen is formed on the insulating film. As the film formed of a material containing at least hydrogen, a semiconductor film, a nitride film, or the like can be applied. A semiconductor film is formed in this embodiment mode. After that, thermal treatment for diffusing the hydrogen contained in the film of a material containing at least hydrogen is performed. This thermal treatment is performed at a temperature of 410° C. or higher, and may be performed separately from a forming process of a polysilicon film or may be performed as well as for the forming process of a polysilicon film to reduce the number of steps. For example, in the case where an amorphous silicon film containing hydrogen is used as the material film containing hydrogen and heated to form a polysilicon film, if thermal treatment is performed at a temperature of 450° C. or higher for crystallization, diffusion of hydrogen can be performed as well as the polysilicon film is formed.

Then, by a known technique, the polysilicon film is etched to have a desired shape so that a plurality of TFTs is formed. Each TFT has a polysilicon film including a source region, a drain region, and a channel forming region, a gate insulating film which covers the polysilicon film, a gate electrode formed on the channel forming region of the polysilicon film, and a source electrode and a drain electrode which are connected to the source region and the drain region through an interlayer insulating film. It is to be noted that an amplifier circuit is configured by combining the plurality of TFTs.

Subsequently, a first electrode is formed which covers a wire connected to the gate electrode of one TFT of the plurality of TFTs.

Then, a photoelectric conversion element (a light sensor) is formed so as to partially overlap the first electrode. In this embodiment mode, a diode is formed as the photoelectric conversion element. An amorphous silicon film (or a microcrystalline silicon film) which is a photoelectric conversion layer and a second electrode are formed on the first electrode. After that, the amorphous silicon film (or the microcrystalline silicon film) and the second electrode are etched to have a desired shape so that the diode is formed.

Subsequently, a sealing layer is formed and a terminal electrode 904 is formed. The state at this stage is shown in FIG. 9A. In FIG. 9A, a layer containing an element covered with the sealing layer 903 is shown. It is to be noted that two terminal electrodes 904 are provided in one light sensor and one of the terminal electrodes is connected to the second electrode.

Then, a fixed substrate 906 for fixing the layer containing an element 903 is attached by an adhesive material 905. It is preferable that a substrate which is more rigid than the glass substrate 901 is used as the fixed substrate 906. In addition, an adhesive agent made of an organic material which can be removed by an etchant is preferably used as the adhesive material 905. Herein, a water-soluble resin is applied as the adhesive material 905 and thereon a member with both surfaces covered with a reactive peeling type adhesive material (hereinafter referred to as a double-sided sheet) is used.

Subsequently, the metal film 902 on the glass substrate 901 and the layer containing an element 903 are peeled off each other by a physical means. (FIG. 9B) The peeling-off occurs within the metal oxide film, at an interface between the insulating film and the metal oxide film, or at an interface between the metal oxide film and the metal film so that the layer containing an element 903 can be peeled off the glass substrate with comparatively small force.

Then, a plastic substrate 908a and the layer 903 containing an element are attached to each other with an adhesive material 907a as shown in FIG. 9C. As the plastic substrate 908a, a synthetic resin is used. It is preferable that a plastic substrate made of PET (polyethylene terephthalate), PEN (polyethylene naphthalate), PES (polyether sulfone), polypropylene, polypropylene sulfide, polycarbonate, polyetherimide, polyphenylene sulfide, polyphenylene oxide, polysulfone, or polyphthalamide is used as the plastic substrate.

As the adhesive material 907a, various kinds of curable adhesive agents such as a reactive curable adhesive agent, a heat-curable adhesive agent, a light-curable adhesive agent such as an ultraviolet ray-curable adhesive agent, and an anaerobic adhesive agent can be used.

Then, as shown in FIG. 9D, the adhesive material 905 is removed to separate the fixed substrate 906. The adhesive material 905 is removed by heat reaction, light reaction, reaction of humidity, or chemical reaction (e.g., water, oxygen, etc.).

Finally, division is performed by a cutter, dicing, or the like to obtain a state shown in FIG. 9E. FIG. 9E shows a case where four chips each having a light sensor and an amplifier circuit are formed. In this manner, a chip in which the light sensor and the amplifier circuit are fixed to a plastic substrate 908b with an adhesive material 907b can be obtained.

The peeling method using a metal film and an oxide layer is applied herein, however, the present invention is not limited to this. For example, the light sensor and the amplifier circuit may be peeled off the glass substrate by a method of dissolving the glass substrate by an etchant or a method of removing the glass substrate by grinding. Alternatively, the light sensor and the amplifier circuit may be peeled off the glass substrate by such a method that the light sensor and the amplifier circuit are formed on an amorphous silicon film (or a tungsten film or a tungsten oxide film) and then only the amorphous silicon film (or the tungsten film or the tungsten oxide film) is removed by an etching gas or an etchant. Further alternatively, the light sensor and the amplifier circuit may be peeled off the glass substrate by that the light sensor and the amplifier circuit are formed on an amorphous silicon film containing hydrogen and then ablation is generated in the amorphous silicon film containing hydrogen by irradiating laser light thereto.

This embodiment mode can be freely combined with Embodiment Mode 1, Embodiment Mode 2, or Embodiment Mode 3.

Embodiment Mode 5

Various electronic apparatuses can be manufactured by incorporating the light sensor chip according to the present invention. As the electronic apparatuses, there are a video camera, a digital camera, a goggle type display (a head mounted display), a projector, a monitor of a liquid crystal television or the like, a navigation system, a sound reproducing apparatus (e.g., a car audio, an audio component system, etc.), a notebook personal computer, a game machine, a portable information terminal (e.g., a mobile computer, a mobile phone, a mobile game machine, an electronic book, etc.), an image reproducing apparatus provided with a recording medium (specifically a device which plays the recording medium such as a DVD (Digital Versatile Disc) and has a display for displaying the image), and the like.

This embodiment mode shows a case where the light sensor of the present invention is incorporated in the portable information terminal typified by a mobile phone or a PDA.

In recent years, power consumption of illumination such as a backlight tends to increase because information devices such as a mobile phone and a PDA has began to display various colors and the quality of a moving image has been enhanced. On the other hand, it has been demanded to reduce the power consumption without deteriorating the display quality. Consequently, in order to reduce the power consumption, the luminance of the display device is controlled or the illumination of the key switch is controlled by sensing the illuminance of the environment where the information device is used.

FIG. 10A shows a mobile phone including a main body 2001, a housing 2002, a display portion 2003, an operating key 2004, a sound output portion 2005, a sound input portion 2006, light sensor portions 2007 and 2008, and the like. The present invention can be applied to the light sensor portions 2007 and 2008. The luminance of the display portion 2003 is controlled in accordance with the illuminance obtained by the light sensor portion 2007 or the illumination of the key switch 2004 is controlled in accordance with the illuminance obtained by the light sensor portion 2008, thereby the power consumption of the mobile phone can be suppressed.

In the case of a photographing device such as a digital camera or a digital video camera, a sensor for detecting visible light is provided near an eyepiece portion (a view window) of an optical finder and by which whether the photographer views the optical finder or not is detected. For example, when the face of the photographer approaches the eyepiece portion of the finder, a shadow of the photographer covers the eyepiece portion and its vicinity. Accordingly, the detection is performed by utilizing the change of the amount of light to be received by the sensor.

FIG. 10B shows a digital camera including a main body 2101, a display portion 2102, an image receiving portion 2103, an operating key 2104, an external connection port 2105, a shutter 2106, a finder 2107, a light sensor portion 2108, and the like. The present invention can be applied to the light sensor portion 2108. Whether the photographer views the optical finder or not is detected by the change of the amount of light to be received by the light sensor portion 2108 provided near the finder 2107. When the photographer looks through the optical finder, the display portion 2102 is turned off so that power consumption can be suppressed.

In addition, the light sensor element of the present invention can be used for adjusting convergence of a projector.

In addition, when the light sensor of the present invention is mounted in a camera having no display screen (a film camera), a shutter can be operated at the appropriate shutter speed and focus value in accordance with the brightness obtained by the light sensor. The camera mounting the light sensor of the present invention can prevent a failure photograph.

This embodiment mode can be freely combined with Embodiment Mode 1, Embodiment Mode 2, Embodiment Mode 3, and Embodiment Mode 4.

INDUSTRIAL APPLICABILITY

A single crystalline silicon substrate has a limit in size and mass production. However, by manufacturing over a glass substrate or using a plastic substrate which are inexpensive according to the present invention, mass production can be realized over a large-size substrate which is, for example, a substrate having a size of 320 mm×400 mm, 370 mm×470 mm, 550 mm×650 mm, 600 mm×720 mm, 680 mm×880 mm, 1000 mm×1200 mm, 1100 mm×1250 mm, or 1150 mm×1300 mm. In addition, the manufacturing cost per one product can be reduced.

Figure 1A:
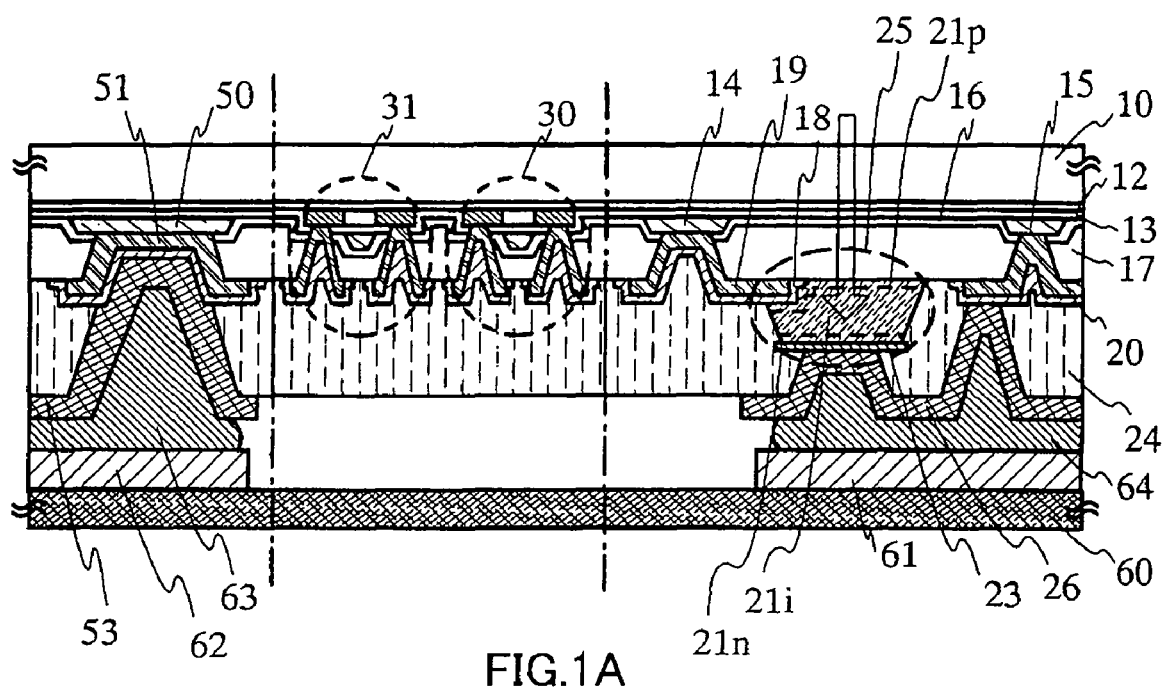
FIGS. 1A and 1B A cross sectional view and a circuit diagram of a light sensor device of the present invention.
Figure 1B:
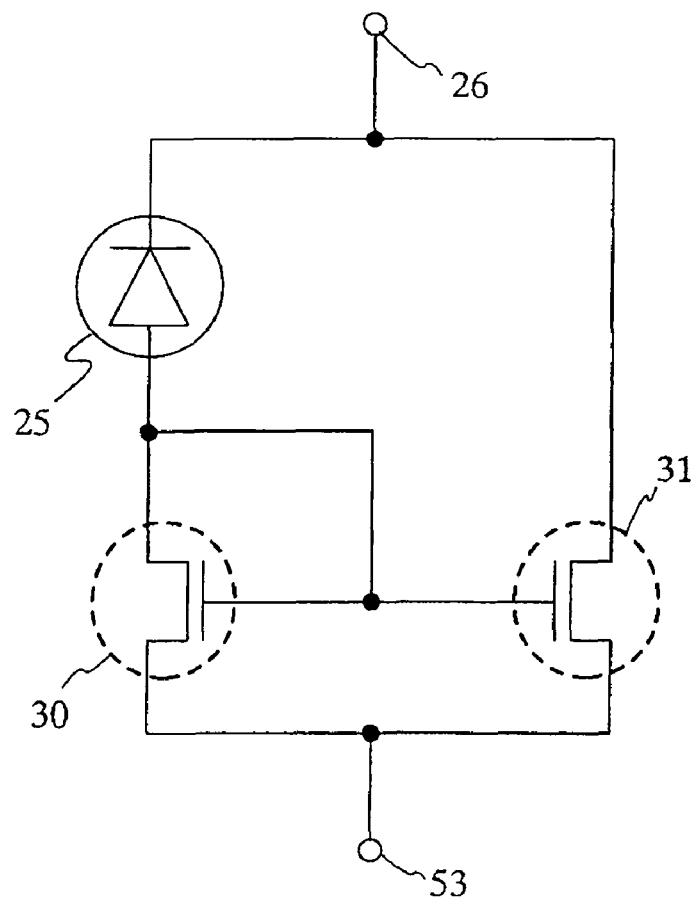
Figure 2A:
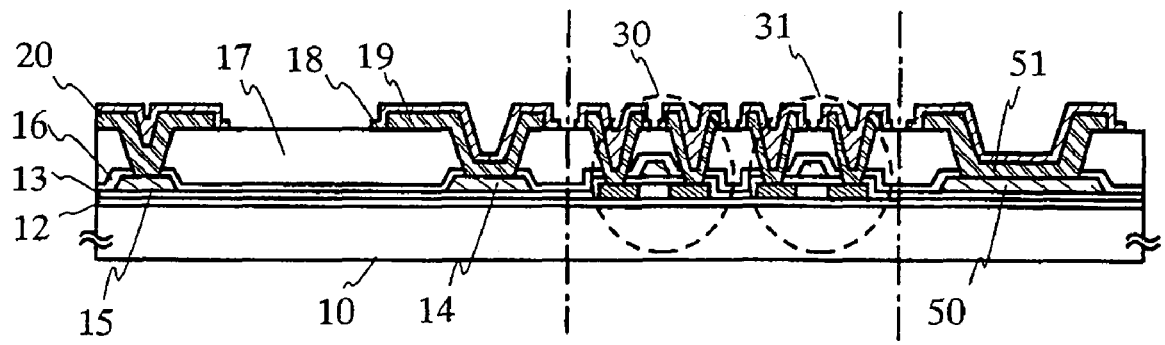
FIGS. 2A to 2C Cross sectional views illustrating manufacturing steps of a light sensor device.
Figure 2B:
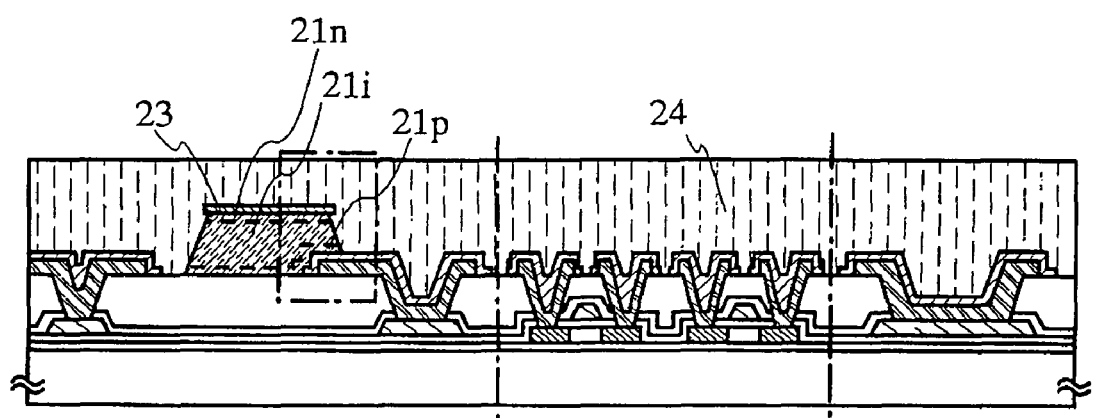
Figure 2C:
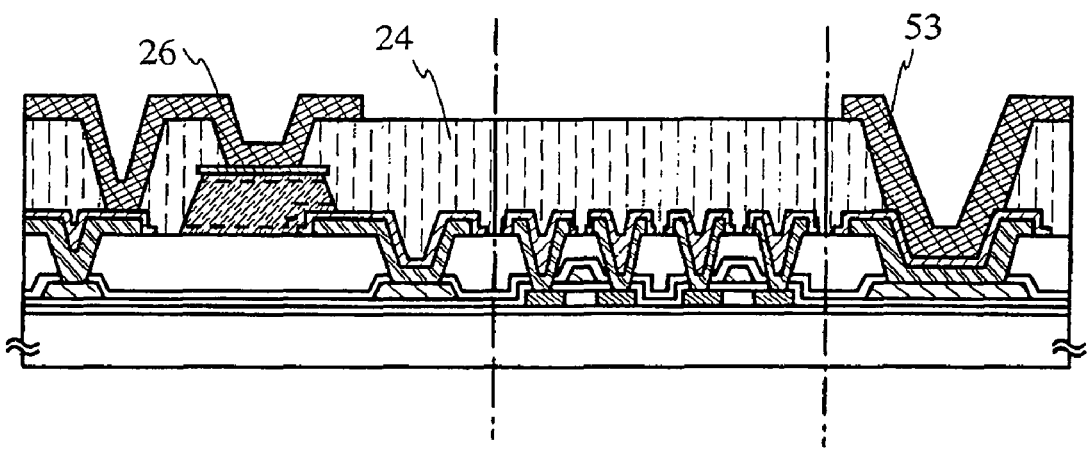
Figure 3A:
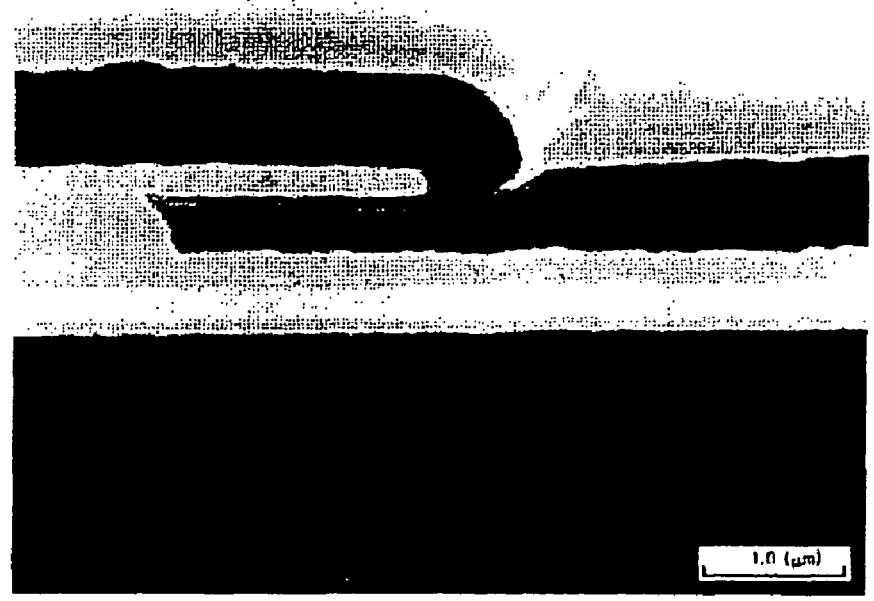
FIGS. 3A and 3B An SEM photograph of a part of a light sensor device and a pattern diagram thereof.
Figure 3B:
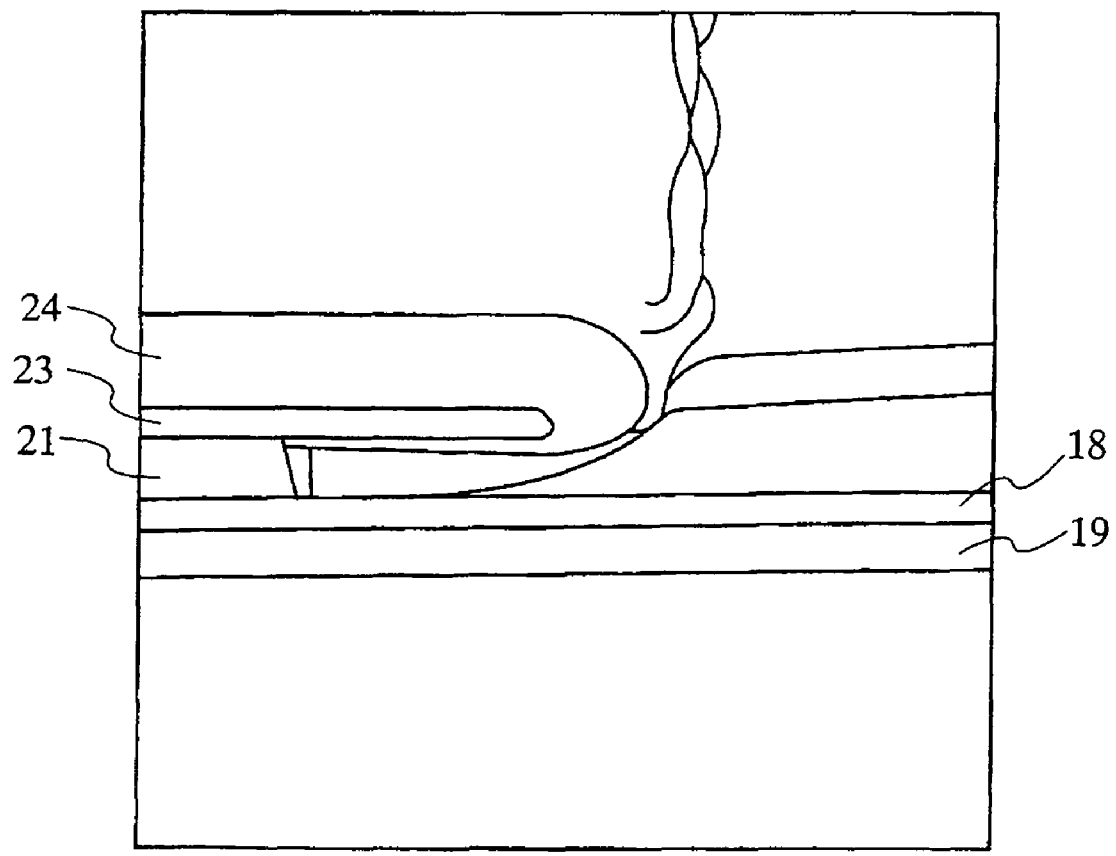
Figure 4A:
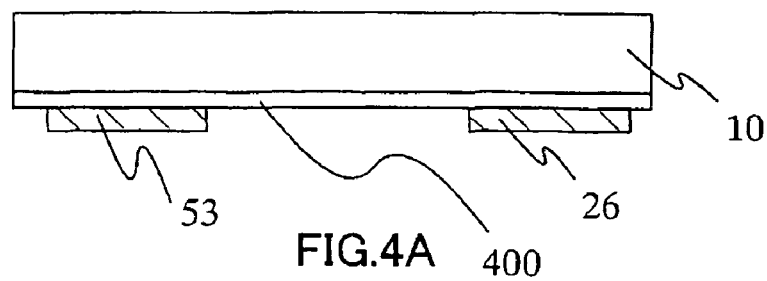
FIGS. 4A to 4D Diagrams illustrating an outer shape of a light sensor device of the present invention FIGS. 5A to 5F Cross sectional process views of a light sensor device of the present invention illustrating Embodiment mode 1.
Figure 4B:
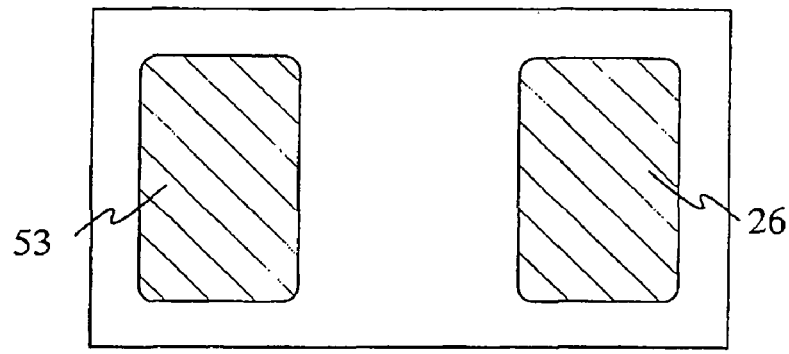
Figure 4C:
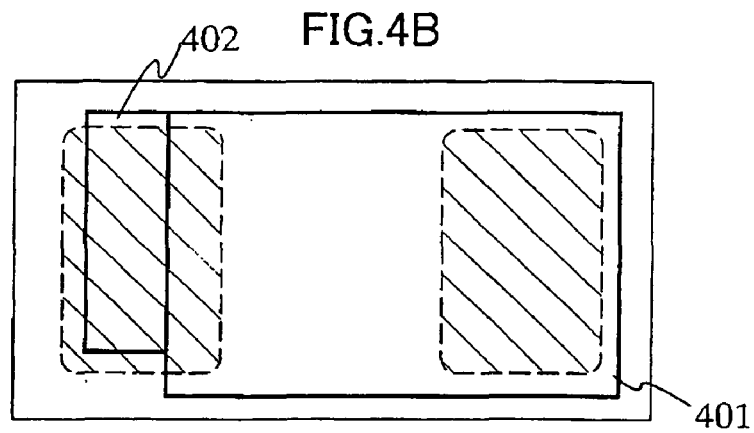
Figure 4D:
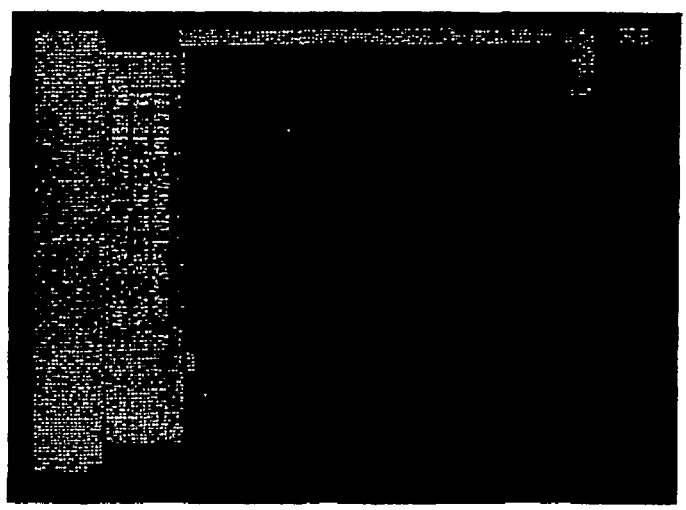
Figure 5A:
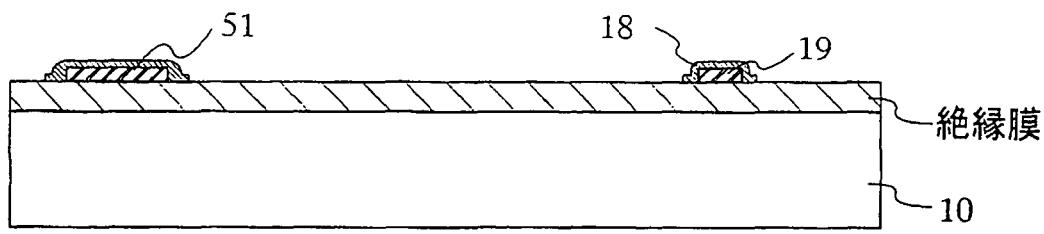
Figure 5B:
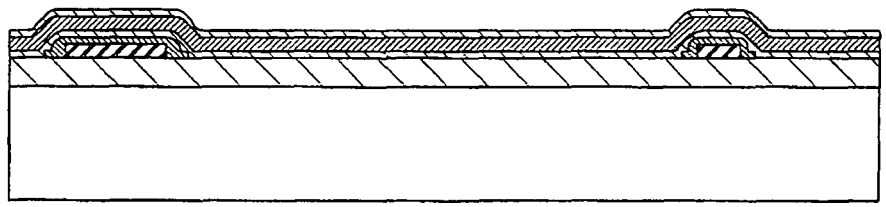
Figure 5C:
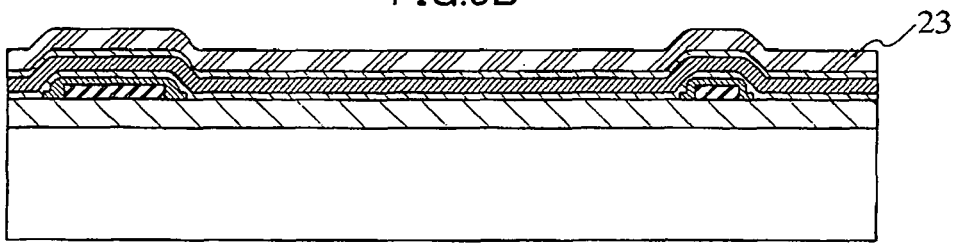
Figure 5D:
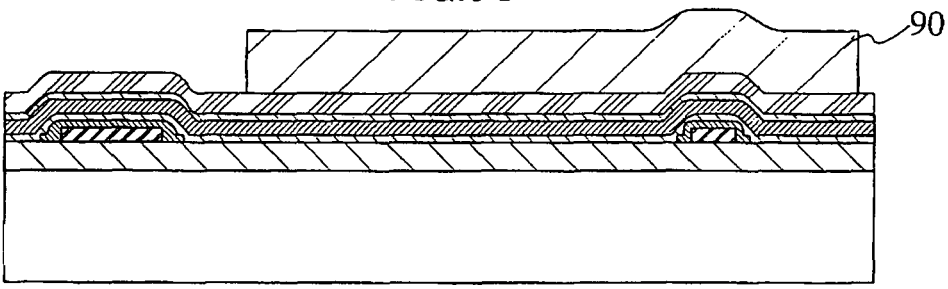
Figure 5E:
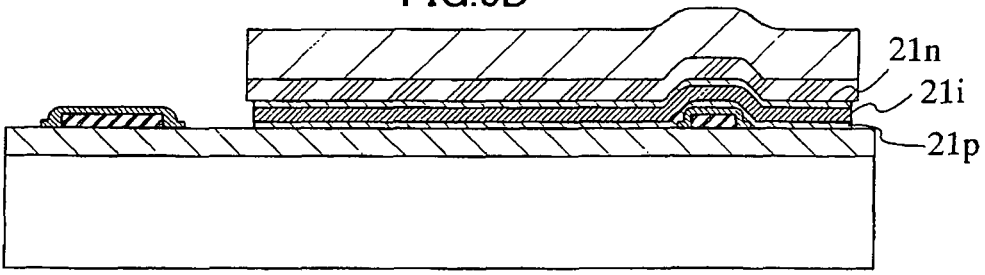
Figure 5F:
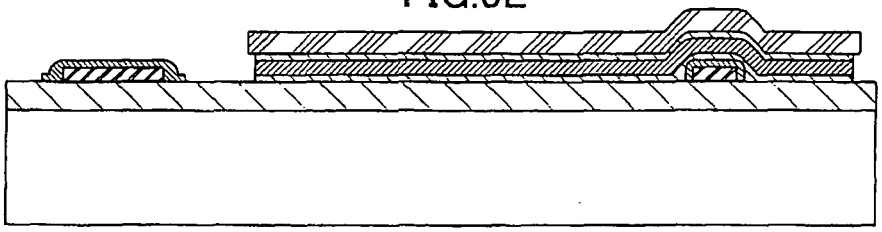
Figure 6A:
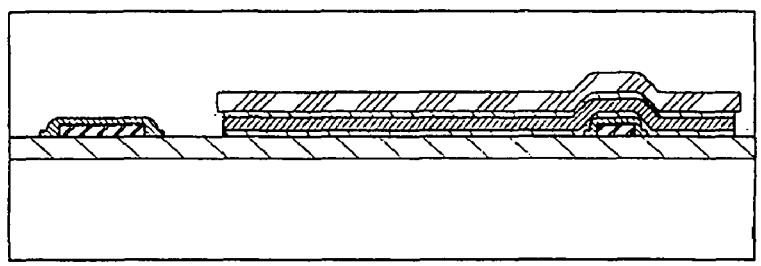
FIGS. 6A to 6E Cross sectional process views of a light sensor device of the present invention illustrating Embodiment mode 1.
Figure 6B:
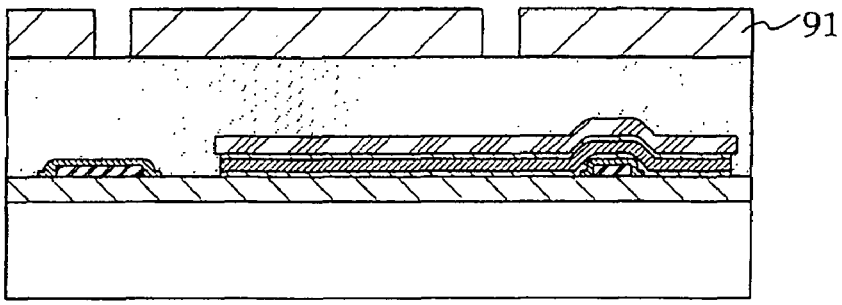
Figure 6C:
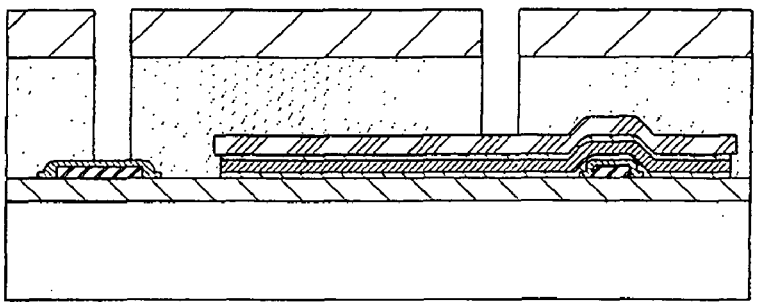
Figure 6D:
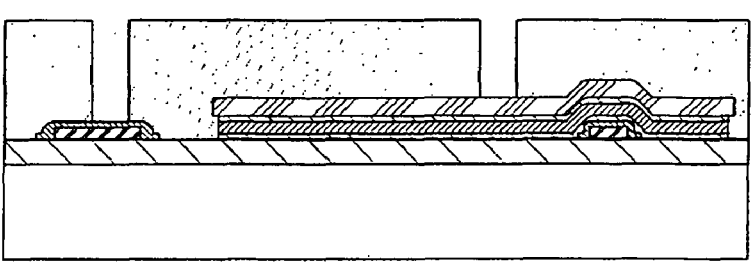
Figure 6E:
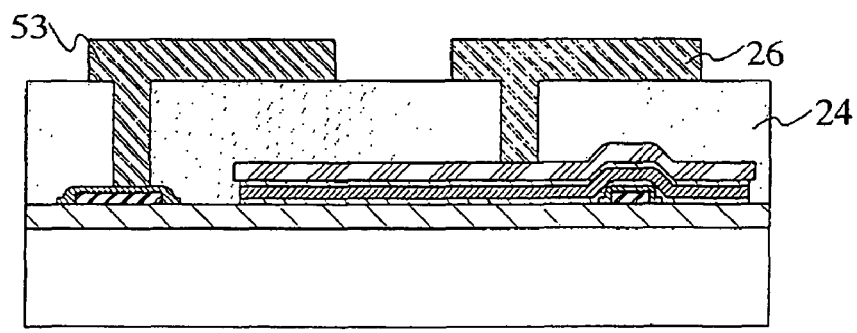
Figure 7A:
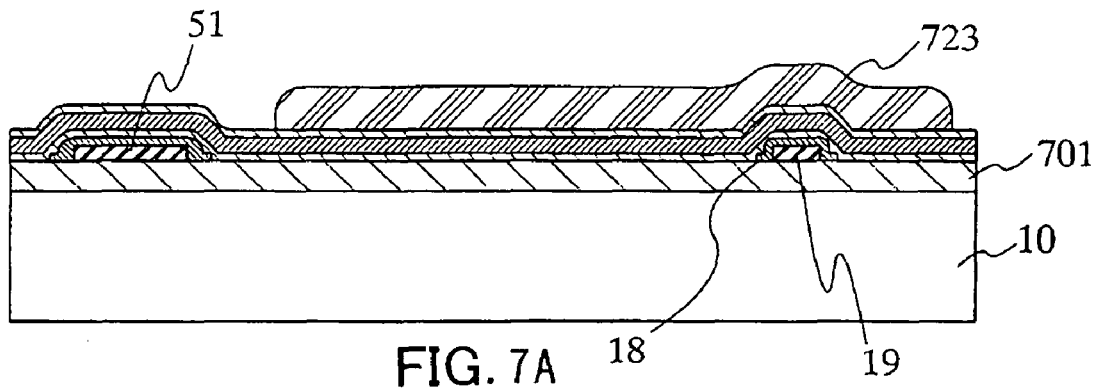
FIGS. 7A to 7D Cross sectional process views of a light sensor device of the present invention illustrating Embodiment mode 1.
Figure 7B:
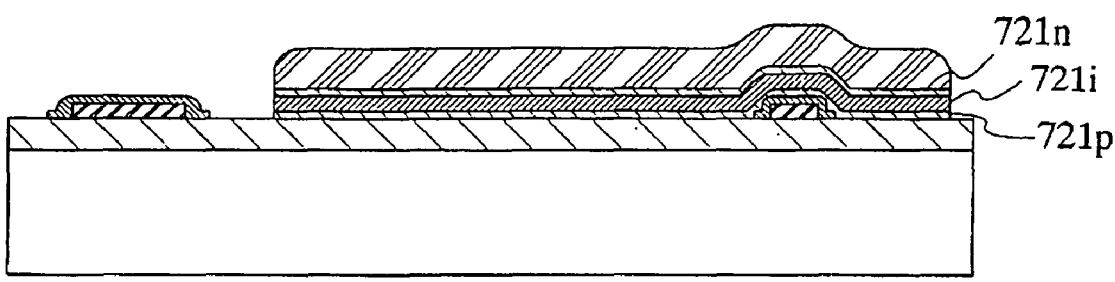
Figure 7C:
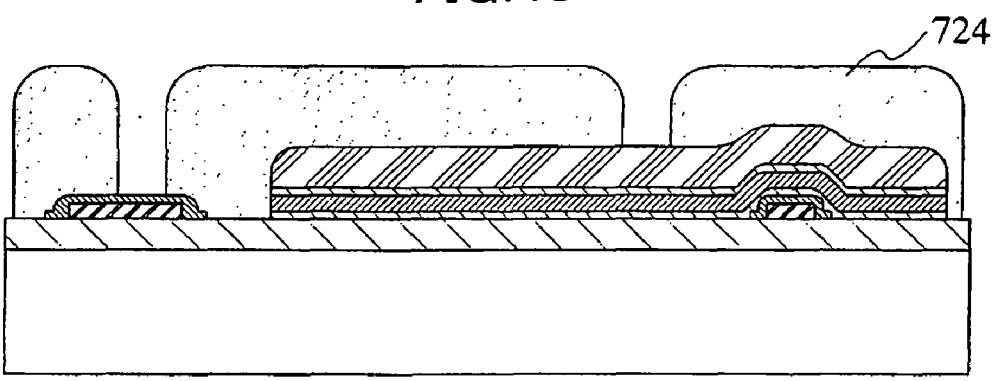
Figure 7D:
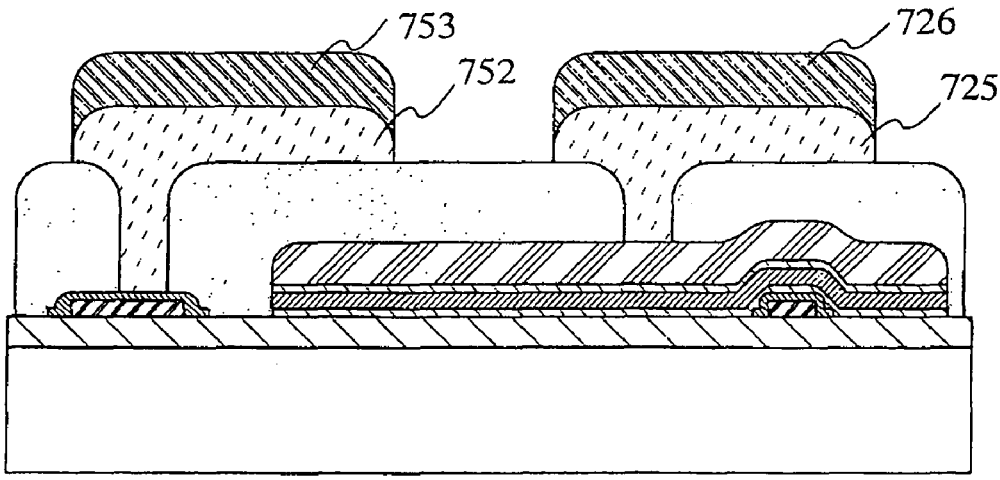
Figure 8A:
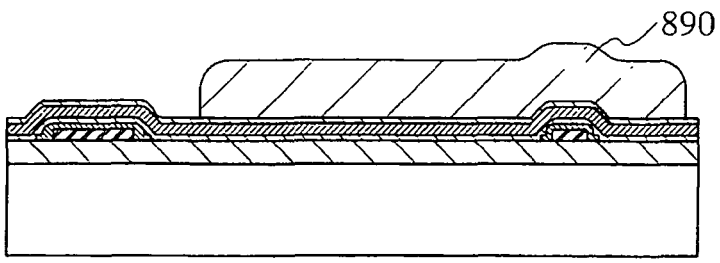
FIGS. 8A to 8F Cross sectional process views of a light sensor device of the present invention illustrating Embodiment mode 1.
Figure 8B:
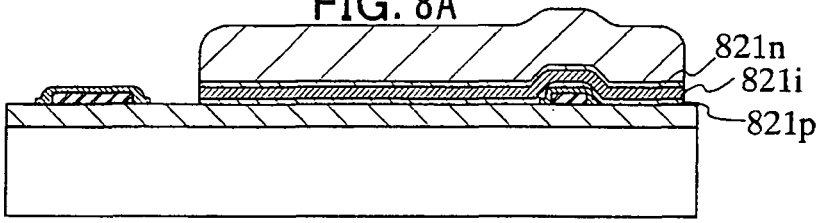
Figure 8C:
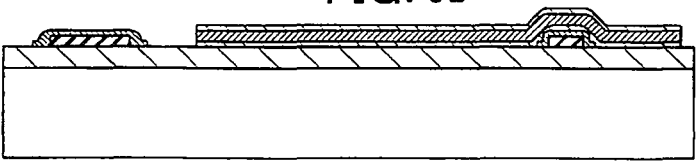
Figure 8D:
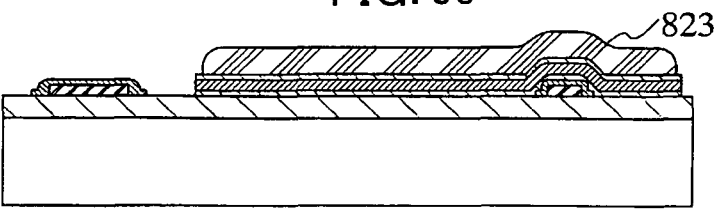
Figure 8E:
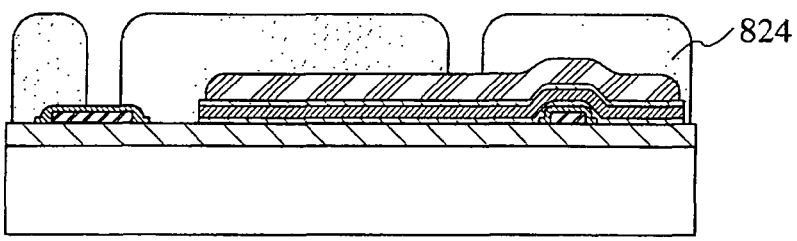
Figure 8F:
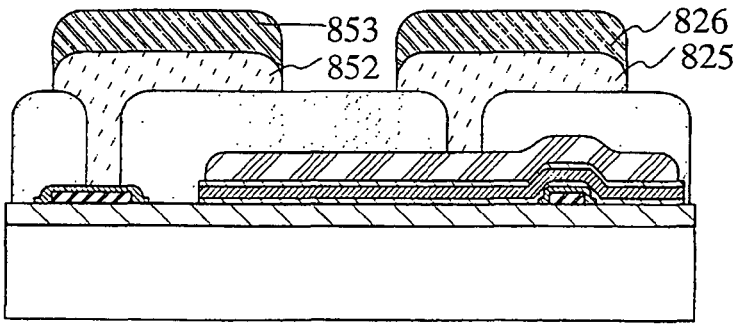
Figure 9A:
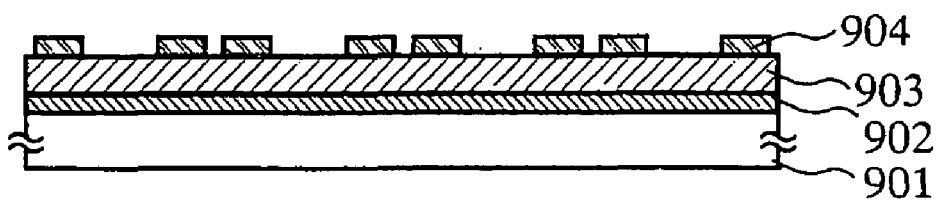
FIGS. 9A to 9E Cross sectional process views of a light sensor device of the present invention illustrating Embodiment mode 1.
Figure 9B:
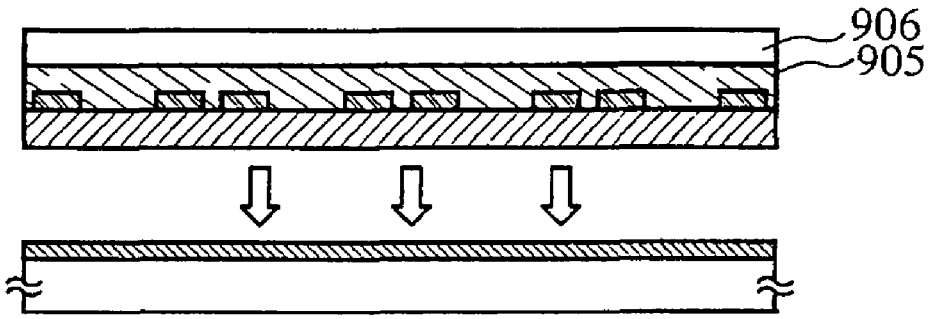
Figure 9C:
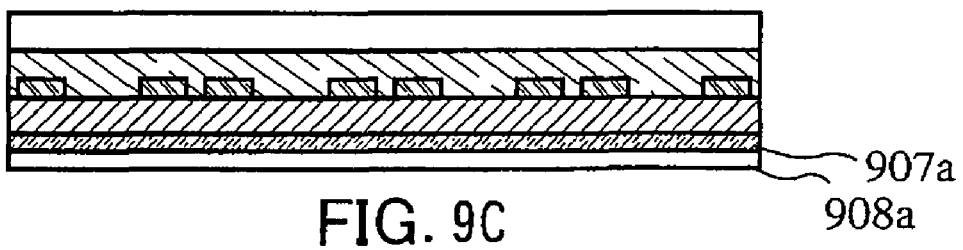
Figure 9D:
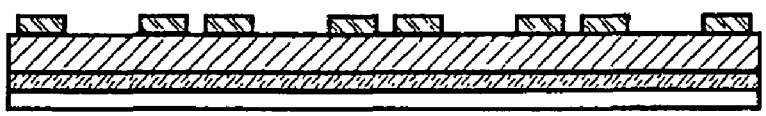
Figure 9E:
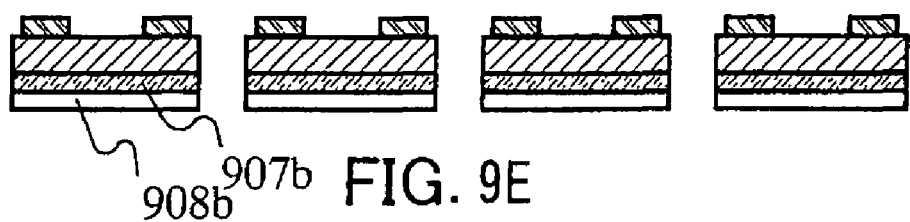
Figure 10A:
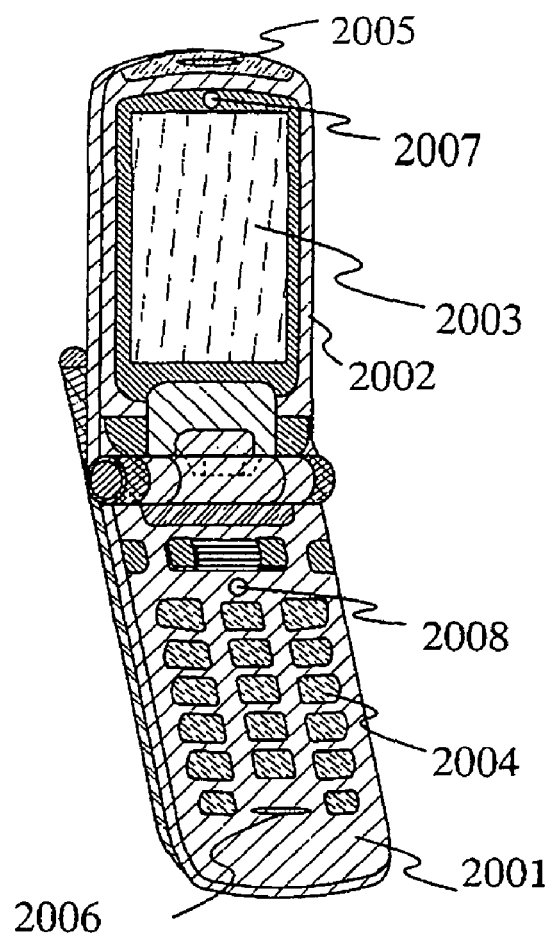
FIGS. 10A and 10B Diagrams illustrating an example of electronic appliances.
Figure 10B:
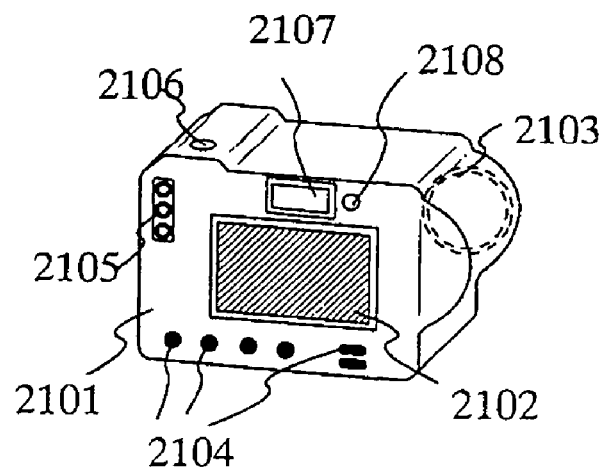

The invention claimed is:

1. A semiconductor device comprising:
a substrate having an insulating surface;
a light sensor element over the insulating surface, the light sensor element comprising a first electrode, a second electrode, and a photoelectric conversion layer;
a wire electrically connected to the first electrode; and
an amplifier circuit including an n-channel TFT, the amplifier circuit over the insulating surface,
wherein the n-channel TFT includes a source electrode, a drain electrode, and a gate electrode,
wherein the gate electrode of the n-channel TFT is electrically connected to the wire,
wherein the wire is covered with the first electrode, wherein the second electrode is provided over the photoelectric conversion layer,
wherein end portions of the second electrode extend beyond end portions of the photoelectric conversion layer, and
wherein the first electrode is a film containing Ti.

2. A semiconductor device comprising:
a substrate having an insulating surface;
a light sensor element over the insulating surface, the light sensor element comprising a first electrode, a second electrode, and a photoelectric conversion layer;
a wire electrically connected to the first electrode; and
an amplifier circuit including a TFT, the amplifier circuit over the insulating surface,
wherein the TFT includes a source electrode, a drain electrode, and a gate electrode,
wherein the gate electrode of the TFT is electrically connected to the wire,
wherein the wire is covered with the first electrode,
wherein the second electrode is provided over the photoelectric conversion layer,
wherein end portions of a top surface of the second electrode extend beyond end portions of the photoelectric conversion layer, and
wherein the first electrode is a film containing Ti.

3. A semiconductor device comprising:
a substrate having an insulating surface;
a light sensor element over the insulating surface; and
an amplifier circuit over the insulating surface,
wherein the amplifier circuit comprises an n-channel TFT having a semiconductor film having a crystalline structure, and
wherein the light sensor element includes a wire connected to the n-channel TFT, a photoelectric conversion layer over the wire, and an electrode on the photoelectric conversion layer, and an end portion of the electrode projects beyond an end portion of the photoelectric conversion layer.

4. A semiconductor device comprising:
a small piece of a substrate having an insulating surface;
a light sensor element over the insulating surface; and
an amplifier circuit over the insulating surface,
an interlayer insulating film over the thin film transistor;
a wire connected to the thin film transistor over the interlayer insulating film;
a photoelectric conversion layer formed over a part of the wire; and
an electrode over the photoelectric conversion layer,
wherein an end portion of the electrode projects than an end portion of the photoelectric conversion layer.

5. The semiconductor device according to claim 1, wherein the photoelectric conversion layer comprises a p-type crystalline semiconductor layer, and
wherein the film containing Ti is in contact with the p-type crystalline semiconductor layer.

6. The semiconductor device according to claim 2, wherein the photoelectric conversion layer comprises a P-type crystalline semiconductor layer, and
wherein the film containing Ti is in contact with the p-type crystalline semiconductor layer.

7. The semiconductor device according to claim 1, wherein the wire has a three-layer structure of a first film containing Ti, a film containing aluminum, and a second film containing Ti.

8. The semiconductor device according to claim 2, wherein the wire has a three-layer structure of a first film containing Ti, a film containing aluminum, and a second film containing Ti.

9. The semiconductor device according to claim 3, wherein the wire has a three-layer structure of a first film containing Ti, a film containing aluminum, and a second film containing Ti.

10. The semiconductor device according to claim 4, wherein the wire has a three-layer structure of a first film containing Ti, a film containing aluminum, and a second film containing Ti.

11. The semiconductor device according to claim 1, wherein the second electrode is a conductive material containing a resin.

12. The semiconductor device according to claim 2, wherein the second electrode is a conductive material containing a resin.

13. The semiconductor device according to claim 3, wherein the electrode is a conductive material containing a resin.

14. The semiconductor device according to claim 4, wherein the electrode is a conductive material containing a resin.

15. The semiconductor device according to claim 1, wherein the second electrode partially overlaps the first electrode and the wire.

16. The semiconductor device according to claim 2, wherein the second electrode partially overlaps the first electrode and the wire.

17. The semiconductor device according to claim 3, wherein the electrode partially overlaps the wire.

18. The semiconductor device according to claim 4, wherein the electrode partially overlaps the wire.

19. The semiconductor device according to claim 1, wherein the substrate is a glass substrate.

20. The semiconductor device according to claim 2, wherein the substrate is a glass substrate.

21. The semiconductor device according to claim 3, wherein the substrate is a glass substrate.

22. The semiconductor device according to claim 4, wherein the substrate is a glass substrate.

23. The semiconductor device according to claim 1, wherein the substrate is a plastic substrate.

24. The semiconductor device according to claim 2, wherein the substrate is a plastic substrate.

25. The semiconductor device according to claim 3, wherein the substrate is a plastic substrate.

26. The semiconductor device according to claim 4, wherein the substrate is a plastic substrate.

27. The semiconductor device according to claim 1, wherein an external terminal provided over the substrate has a two-terminal structure.

28. The semiconductor device according to claim 2, wherein an external terminal provided over the substrate has a two-terminal structure.

29. The semiconductor device according to claim 3, wherein an external terminal provided over the substrate has a two-terminal structure.

30. The semiconductor device according to claim 4, wherein an external terminal provided over the substrate has a two-terminal structure.

31. The semiconductor device according to claim 1, wherein the semiconductor device is selected from the group consisting of a video camera, a digital camera, a personal computer, and a portable information terminal.

32. The semiconductor device according to claim 2, wherein the semiconductor device is selected from the group consisting of a video camera, a digital camera, a personal computer, and a portable information terminal.

33. The semiconductor device according to claim 3, wherein the semiconductor device is selected from the group consisting of a video camera, a digital camera, a personal computer, and a portable information terminal.

34. The semiconductor device according to claim 4, wherein the semiconductor device is selected from the group consisting of a video camera, a digital camera, a personal computer, and a portable information terminal.

* * * * *